United States Patent
Ahn

(10) Patent No.: US 8,373,153 B2
(45) Date of Patent: Feb. 12, 2013

(54) PHOTODETECTORS

(75) Inventor: Doyeol Ahn, Seoul (KR)

(73) Assignee: University of Seoul Industry Cooperation Foundation, Seoul (KR)

( * ) Notice: Subject to any disclaimer, the term of this patent is extended or adjusted under 35 U.S.C. 154(b) by 18 days.

(21) Appl. No.: 12/472,168

(22) Filed: May 26, 2009

(65) Prior Publication Data

US 2010/0301308 A1  Dec. 2, 2010

(51) Int. Cl.
 *H01L 29/66* (2006.01)
 *H01L 21/36* (2006.01)
(52) U.S. Cl. ......... 257/14; 257/9; 257/12; 257/E29.168; 257/E33.076
(58) Field of Classification Search ............... 257/9–39, 257/E29.069–E29.071, E29.245, E49.001–E49.004
 See application file for complete search history.

(56) References Cited

U.S. PATENT DOCUMENTS

| | | | |
|---|---|---|---|
| 3,990,096 A | 11/1976 | Namizaki et al. |
| 4,764,261 A | 8/1988 | Ondris et al. |
| 5,079,774 A | 1/1992 | Mendez et al. |
| 5,112,410 A | 5/1992 | Chen |
| 5,175,739 A | 12/1992 | Takeuchi et al. |
| 5,181,219 A | 1/1993 | Mori et al. |
| 5,181,221 A | 1/1993 | Mori et al. |
| 5,182,757 A | 1/1993 | Mori et al. |
| 5,287,377 A | 2/1994 | Fukuzawa et al. |
| 5,291,507 A | 3/1994 | Haase et al. |
| 5,295,148 A | 3/1994 | Mori et al. |
| 5,317,584 A | 5/1994 | Mori et al. |
| 5,404,027 A | 4/1995 | Haase et al. |
| 5,404,369 A | 4/1995 | Mori et al. |
| 5,490,953 A | 2/1996 | Morita |
| 5,606,176 A | 2/1997 | Nitta |
| 5,646,419 A | 7/1997 | McCaldin et al. |
| 5,818,072 A | 10/1998 | Schetzina |
| 5,933,444 A | 8/1999 | Molva et al. |
| 6,069,380 A | 5/2000 | Chou et al. |
| 6,515,313 B1 | 2/2003 | Ibbetson et al. |
| 6,627,914 B1 | 9/2003 | Komiyama et al. |
| 6,803,596 B2 | 10/2004 | Hata |
| 6,813,063 B2 | 11/2004 | Ishihara |
| 6,891,329 B2 | 5/2005 | Nagano et al. |
| 7,420,225 B1 | 9/2008 | Wanke et al. |
| 7,638,817 B2 | 12/2009 | Shur et al. |

(Continued)

FOREIGN PATENT DOCUMENTS

| | | |
|---|---|---|
| JP | 09199783 | 7/1997 |
| JP | 07202340 | 8/2007 |

(Continued)

OTHER PUBLICATIONS

D. Ahn, et al "Optical Gain and Luminescence of a ZnO-MgZnO Quantum Well" IEEE Photonics Technology Letters, vol. 18, No. 2, Jan. 15, 2006 pp. 349-351.

(Continued)

*Primary Examiner* — Mamadou Diallo
(74) *Attorney, Agent, or Firm* — Workman Nydegger

(57) ABSTRACT

Implementations of quantum well photodetectors are provided. In one embodiment, a quantum structure includes a first barrier layer, a well layer located on the first barrier layer, and a second barrier layer located on the well layer. A metal layer is located adjacent to the quantum structure.

26 Claims, 9 Drawing Sheets

U.S. PATENT DOCUMENTS

| | | | |
|---|---|---|---|
| 2002/0031153 A1 | 3/2002 | Niwa et al. | |
| 2002/0150135 A1 | 10/2002 | Naone et al. | |
| 2004/0058467 A1 | 3/2004 | Chirovsky et al. | |
| 2004/0095978 A1* | 5/2004 | Cheng et al. | 372/45 |
| 2004/0183087 A1 | 9/2004 | Gardner | |
| 2004/0232412 A1 | 11/2004 | Burgener, II et al. | |
| 2005/0074576 A1 | 4/2005 | Chaiken et al. | |
| 2005/0185686 A1 | 8/2005 | Rupasov et al. | |
| 2005/0285128 A1 | 12/2005 | Scherer et al. | |
| 2006/0244003 A1 | 11/2006 | Ueda | |
| 2007/0063304 A1 | 3/2007 | Matsumoto et al. | |
| 2007/0126021 A1* | 6/2007 | Ryu et al. | 257/103 |
| 2007/0126037 A1 | 6/2007 | Ikeda | |
| 2007/0194297 A1 | 8/2007 | McCarthy et al. | |
| 2007/0298551 A1 | 12/2007 | Bouvet et al. | |
| 2008/0048193 A1 | 2/2008 | Yoo et al. | |
| 2008/0197366 A1 | 8/2008 | Yoo et al. | |
| 2009/0017268 A1 | 1/2009 | Skipor et al. | |
| 2009/0020149 A1 | 1/2009 | Woods et al. | |
| 2009/0106583 A1 | 4/2009 | Kawamura | |
| 2009/0114940 A1* | 5/2009 | Yang et al. | 257/99 |
| 2009/0121628 A1 | 5/2009 | Cho et al. | |
| 2009/0273820 A1 | 11/2009 | Dionne et al. | |
| 2009/0310640 A1 | 12/2009 | Sato et al. | |
| 2010/0096001 A1 | 4/2010 | Sivananthan et al. | |
| 2010/0155696 A1 | 6/2010 | Duan et al. | |
| 2010/0261338 A1 | 10/2010 | Tsakalakos et al. | |
| 2010/0276661 A1 | 11/2010 | Ahn | |
| 2010/0301454 A1 | 12/2010 | Zhang et al. | |
| 2010/0326489 A1 | 12/2010 | Ahn | |
| 2011/0001121 A1 | 1/2011 | Ahn | |
| 2011/0001122 A1 | 1/2011 | Ahn | |
| 2011/0001124 A1 | 1/2011 | Ahn | |
| 2011/0001125 A1 | 1/2011 | Ahn | |
| 2011/0043884 A1 | 2/2011 | Ahn | |
| 2011/0095309 A1 | 4/2011 | Ahn | |
| 2011/0114995 A1 | 5/2011 | Ahn | |
| 2012/0040483 A1 | 2/2012 | Ahn | |

FOREIGN PATENT DOCUMENTS

| | | |
|---|---|---|
| WO | WO 2009067347 | 5/2009 |
| WO | WO 2009106583 | 9/2009 |
| WO | WO 2010137865 | 12/2010 |
| WO | WO 2011004990 | 1/2011 |

OTHER PUBLICATIONS

Sergey I. Bozhevolnyi, et al "Channel Plasmon-Polariton Guiding by Subwavelength Metal Grooves" Physical Review Letters, vol. 95, 046802, Jul. 22, 2005, pp. 046802-1-046802-4.

I.V. Bradley, et al "Space-charge effects in type-II strained layer superlattices" Journal of Crystal Growth 184/185 (1998) pp. 728-731.

A. Jia, et al "Design of new UV/blue/green light emitters made of hexagonal-phase ZnMgCdOSSe mixed-crystal system fabricated on GaAs- and InP-(1 1 1) substrates" Journal of Crystal Growth 214/215 (2000) pp. 1085-1090.

P.I. Kuznetsov, et al "Hexagonal ZnCdS epilayers and CdSSe/ZnCdS SQ structures on CdS(0001) and ZnCdS (0001) substrates grown by MOVPE" Physica E, vol. 17 (2003) pp. 516-517.

K. Leosson, et al "Long-range surface plasmon polariton nanowire waveguides for device applications" Optics Express, vol. 14, No. 1, Jan. 9, 2006 pp. 314-319.

Liu Liu, et al "Novel surface plasmon waveguide for high integration" Optics Express, vol. 13, No. 17, Aug. 22, 2005 pp. 6645-6650.

Arup Neogi, et al "Enhancement of spontaneous recombination rate in a quantum well by resonant surface plasmon coupling" Physical Review B, vol. 66 (2002) pp. 153305-1-153305-4.

Koichi Okamoto, et al "Surface-plasmon-enhanced light emitters based on InGaN quantum wells" Nature Materials, vol. 3, Sep. 2004, pp. 601-605.

Seoung-Hwan Park, et al "Spontaneous and piezoelectric polarization effects in wurtzite ZnO/MgZnO quantum well lasers" Applied Physics Letters, vol. 87, 253509 (2005) pp. 253509-1-253509-3.

Seoung-Hwan Park, et al "Optical gain in InGaN/InGaAlN quantum well structures with zero internal field" Applied Physics Letters, vol. 92, 171115 (2008) pp. 171115-1-171115-3.

J. Ueno, et al "MBE growth of AnSe/MgCdS and ZnCdS/MgCdS superlattices for UV-A sensors" Phys. Stat. Sol. (c) 3, No. 4, pp. 1225-1228 (2006).

Chul Huh, et al., "Improvement in light-output efficiency of InGaN/GaN multiple-quantum well light-emitting diodes by current blocking layer", Appl. Phys., vol. 92, No. 5, Sep. 1, 2002, 2248-2250, American Institute of Physics.

Seong-Ran Jeon, et al., "GaN tunnel junction as a current aperture in a blue surface-emitting light-emitting diode", Appl. Phys. Lett., vol. 80, No. 11, Mar. 18, 2002, 1933-1935, American Institute of Physics.

Seoung-Hwan Park, et al., "Crystal-orientation effects on the piezoelectric field and electronic properties of strained wurtzite semiconductors", vol. 59, No. 7, Feb. 15, 1999, 4725-4737, The American Physical Society.

Seoung-Hwan Park, "Crystal Orientation Effects in Electronic Properties of Wurtzite GaN/AlGaN Quantum Wells with Spontaneous and Piezoelectric Polarization", Jpn. J. Appl. Phys. vol. 39, Part 1, No. 6A, Jun. 2000, 3478-3482, The Japan Society of Applied Physics.

P. Waltereit, et al., Nitride semiconductors free of electrostatic fields for efficient white light-emitting diodes, Nature, vol. 406, Aug. 24, 2000, 865-868, Macmillan Magazines Ltd.

D. Ahn, et al., "A field-effect quantum-well laser with lateral current injection", J.Appl. Phys. 64(1), Jul. 1, 1988, 440-442, American Institute of Physics.

Hyunsoo Kim, et al., "Lateral current transport path, a model for GaN-based light-emitting diodes: application to practical device designs", Appl. Phys. Lett., vol. 81, No. 7, Aug. 12, 2002, 1326-1328, American Institute of Physics.

Seong-Ran Jeon, et al., "Lateral current spreading in GaN-based light-emitting diodes utilizing tunnel contact junctions", Appl. Phys. Lett., vol. 78, No. 21, May 21, 2001, 3265-3267, American Institute of Physics.

Hetterich J., et al, Optimized Design of Plasmonic MSM Photodetector, IEEE Journal of Quantum Electronics, Oct. 2007, vol. 43, No. 10, pp. 855 to 859.

Taguchi, T., et al., Ultraviolet Laser and Photodetector of CdZnS/ZnS Multiple Quantum Wells, Physica B. 1993, vol. 191, pp. 136 to 139.

Yu, E. T., et al., Plasmonic Nanoparticle Scattering for Enhanced Performance of Photovoltaic and Photodetector Devices, Proceedings of SPIE, Aug. 28, 2008, vol. 7033, Plasmonics: Nanoimaging, Nanofabrication and their Applications IV, pp. 70331V-1 to 70331V-9.

Sumith, B. et al., Quantum Well Infrared Photodetectors for Long Wavelength Infrared Applications, Proceedings of SPIE, Oct. 1998, vol. 3436, Infrared Technology and Applications XXIV, pp. 280 to 284.

Seoung-Hwan Park, et al "Many-body optical gain of wurtzite GaN-based quantum-well lasers and comparison with experiment" Appl. Phys. Lett. 72 (3), Jan. 19, 1998, pp. 287-289.

Seoung-Hwan Park, et al "Piezoelectric effects on electrical and optical properties of wurtzite GaN/AlGaN quantum well lasers" Applied Physics Letters vol. 72, No. 24, Jun. 15, 1998, pp. 3103-3105.

Seoung-Hwan Park, et al "Many-body optical gain and intraband relaxation time of wurtzite InGaN/GaN quantum-well lasers and comparison with experiment" Applied Physics Letters 87, 044103 (2005).

Jie Liu, et al "AlGaN/GaN/InGaN/GaN DH-HEMTs With an InGaN Notch for Enhanced Carrier Confinement" IEEE Electron Device Letters, vol. 27, No. 1, Jan. 2006, pp. 10-12.

Doyeol Ahn, et al "Non-Markovian Gain of Strained-Layer Wurtzite GaN Quantum-Well Lasers with Many-Body Effects" IEEE Journal of Selected Topics in Quantum Electronics, vol. 4, No. 3, May/Jun. 1998, pp. 520-526.

Doyeol Ahn "Theory of Non-Markovian Gain in Strained-Layer Quantum-Well Lasers with Many-Body Effects" IEEE Journal of Quantum Electronics, vol. 34, No. 2, Feb. 1998, pp. 344-352.

Yifei Zhang, et al "Charge control and mobility studies for an AiGan/GaN high electron mobility transistor" Journal of Applied Physics, vol. 85, No. 1, Jan. 1, 1999, pp. 587-594.

Tsung-Hsing Yu, et al "Theoretical study of the two-dimensional electron mobility in strained III-nitride heterostructures" Journal of Applied Physics, vol. 89, No. 7, Apr. 1, 2001, pp. 3827-3834.

D. Ahn, et al "Electric field dependence of instrasubband polar-optical-phonon scattering in a quantum well" Physical Review B, vol. 37, No. 5, Feb. 15, 1988-I, pp. 2529-2535.

Doyeol Ahn "Time-convolutionless reduced-desnsity-operator theory of an arbitrary driven system coupled to a stochastic reservoir: Quantum kinetic equations for semiconductors" Physical Review B, vol. 50, No. 12, Sep. 15, 1994-II, pp. 8310-8318.

Doyeol Ahn "Time-convolutionless reduced-desnsity-operator theory of an arbitrary driven system coupled to a stochastic reservoir. II. Optical gain and line-shape function of a driven semiconductor" Physical Review B, vol. 51, No. 4, Jan. 15, 1995-II, pp. 2159-2166.

Seoung-Hwan Park, et al "Crystal-orientation effects on the piezoelectric field and electronic properties of strained wurtzite semiconductors" Physical Review B, vol. 59, No. 7, Feb. 15, 1999-I, pp. 4725-4737.

International Search Report and Written Opinion, mailed Aug. 10, 2010, as issued in connection with Patent Application No. PCT/KR2010/003322, filed on May 26, 2010.

International Search Report and Written Opinion, mailed Sep. 10, 2010, as issued in connection with Patent Application No. PCT/KR2010/004350, filed on Jul. 5, 2010.

U.S. Appl. No. 12/606,880, filed Oct. 27, 2009, Ahn.

Australian Patent Office; International Search Report and Written Opinion in corresponding PCT application (PCT/KR2010/007292); mailed Jan. 26, 2011.

D-M. Yeh, et al "Surface plasmon coupling effect in an InGaN/GaN single-quantum-well light-emitting diode" Appl. Phys. Lett. 91, 171103 (2007).

E. H. Sargent, et al "Lateral Injection Lasers" International Journal of High Speed Electronics and Systems, Dec. 1998, vol. 9, No. 4, pp. 941-978.

R. Paschotta "Encyclopedia of Laser Physics and Technology, Volume 1", Wiley-VCH, 2008, ISBN 3527408282, 9783527408283 p. 595.

S. Bai, et al. "Determination of the electric field in 4H/3C/4H-SiC quantum wells due to spontaneous polarization in the 4H SiC matrix" Appl. Phys. Lett. 83,3171 (2003).

U.S. Appl. No. 12/498,228, mailed Sep. 1, 2010, Office Action.
U.S. Appl. No. 12/498,228, mailed Dec. 23, 2010, Office Action.
U.S. Appl. No. 12/498,265, mailed May 17, 2011, Office Action.
U.S. Appl. No. 12/498,204, mailed Apr. 26, 2011, Office Action.
U.S. Appl. No. 12/606,880, mailed Apr. 29, 2011, Office Action.
U.S. Appl. No. 12/498,228, mailed Jul. 12, 2011, Office Action.
U.S. Appl. No. 12/498,204, mailed Jul. 21, 2011, Notice of Allowance.

Al-Salim, Najeh, Synthesis of CdSeS Nanocrystals in Coordinating and Noncoordinating Solvents: Solvent's Role in Evolution of the Optical and Structural Properties, Mar. 26, 2007.

B. Ullrich, Semiconductor Science and Technology "Green emission and bandgap narrowing due to two-photon excitation in thin film CdS formed by spray pyrolysis", published Jun. 22, 2011.

Siliconfareast.com; "Lattice Constants"; http://www.siliconfareast.com/lattice_constants.htm; 2 pages; retrieved Oct. 7, 2011.

Wikipedia; "Wurtzite crystal structure", http://en.wikipedia.org/wiki/Wurtzite_crystal_structure; 1 page; retrieved Oct. 7, 2011.

U.S. Appl. No. 12/498,265, mailed Aug. 26, 2011, Office Action.
U.S. Appl. No. 12/498,204, mailed Jul. 28, 2011, Notice of Allowance.
U.S. Appl. No. 12/498,204, mailed Oct. 25, 2011, Notice of Allowance.
U.S. Appl. No. 12/606,880, mailed Aug. 15, 2011, Notice of Allowance.
U.S. Appl. No. 12/498,257, mailed Nov. 23, 2011, Office Action.
U.S. Appl. No. 12/606,880, mailed Nov. 17, 2011, Notice of Allowance.
U.S. Appl. No. 12/498,265, mailed Feb. 28, 2012, Office Action.
U.S. Appl. No. 12/606,880, mailed Feb. 16, 2012, Notice of Allowance.
U.S. Appl. No. 12/498,204, mailed Feb. 1, 2012, Office Action.

Alda, Javier et al., "Optical antennas for nano-photonic applications," vol. 16, No. 5, Trends on Nanothecnology. TNT2004. Phantoms Foundations. Segovia (Spain). Sep. 13-17, 2004, http://www.iop.org/EJ/abstract/0957-4484/16/5/017.

Hoang, T. et al., "A high efficiency lateral light emitting device on SOI," Electron Devices for Microwave and Optoelectronic Applications, EDMO 2004, 12th International Symposium, Nov. 8-9, 2004, pp. 87-91.

LEDs Magazine, "Goldeneye sets brightness benchmark for green LEDs", http://www.ledsmagazine.com/news/5/5/18, May 15, 2008, 2 pages.

Smith S.J. et al., "Lateral light emitting n-i-p diodes in InSb/AlxIn1—xSb quantum wells," Applied Physics Letters, vol. 89, p. 111118 (2006), 3 pages.

U.S. Appl. No. 12/498,228, mailed Dec. 15, 2011, Notice of Allowance.

"II-VI solar cells moving to the production phase," Photovoltaics Bulletin., (2003), vol. 2003, No. 11, Oct. 2003, pp. 10-12.

Andreani, Lucio Claudio, et al, Exchange interaction and polariton effects in quantum-well excitons, Physical Review B, vol. 41, No. 11, pp. 7536-7544 (1990).

Angelakis, D. G., et al., "Photon-blockade-induced Mott transitions and XY spin models in coupled cavity arrays," Phys. Rev. A76, 031805 (2007).

Chu, T.L., and Chu, S.S., "Thin film II-VI photovoltaics," vol. 38, Issue 3, Mar. 1995, pp. 533-549.

Compaan, A. D., et al., "Sputtered II-VI Alloys and Structures for Tandem PV," Subcontract Report NREL/SR-520-43954, Sep. 2008, pp. 64.

Gogolin, O., et al., Temperature dependence of exciton peak energies in Cui quantum dots, Solid State Communications, vol. 122, pp. 511-513 (2002).

Greentree, A.D., et al., "Quantum phase transitions of light," Nature Physics 2, pp. 856-861 (2006).

Hartmann, M.J., and Plenio, M.B., "Strong Photon Nonlinearities and Photonic Mott Insulators," Physical Review Letters, vol. 99, Issue 10, Sep. 7, 2007, pp. 103601-1 to 103601-4.

Kawazoe, T., and Masumoto, Y., "Luminescence Hole Burning and Quantum Size Effects of Charged Excitons in CuCl Quantum Dots," Physical Review Letters, vol. 77, Issue 24, pp. 4942-4945 (1996).

Klimov, V.I., et al., "Optical Gain and Stimulated Emission in Nanocrystal Quantum Dots," Science, Oct. 13, 2000, vol. 290, No. 5490, pp. 314-317.

Little, R. B., et al. "Formation of quantum-dot quantum-well heteronanostructures with large lattice mismatch: ZnS/CdS/ZnS" Journal of Chemical Physics, vol. 114, No. 4, 2001, pp. 1813-1822.

Masumoto, Y., et al., "Observation of persistent spectral hole burning in CuBr quantum dots," Physical Review B, vol. 52, No. 7, pp. 4688-4691 (1995).

Obloh, H., "Group III-nitride based blue emitters," Advances in Solid State Physics, vol. 38, 15-28 (1999).

Park, S.-H., et al., "Internal field engineering in CdZnO/MgZnO quantum well structures," Applied Physics Letters, vol. 94, Issue:8, pp. 083507, 1-3 (2009).

Ricker, T., "Samsung's "world's smallest" 8.4 megapixel CMOS sensor: so long CCD?," accessed at http://www.engadget.com/2007/03/27/samsungs-worlds-smallest-8-4-megapixel-cmos-sensor-so-long/, Mar. 27, 2007, pp. 4.

Tassone, F., et al, "Quantum-well reflectivity and exciton-polariton dispersion," Physical Review B, vol. 45, No. 11, pp. 6023-6030 (1992).

Valenta, J., et al., "Hole-filling of persistent spectral holes in the excitonic absorption band of CuBr quantum dots," Applied Physics Letters, vol. 70, No. 6, pp. 680-682 (1997).

Williams, R.S., et al., "Growth and luminescence spectroscopy of a CuCl quantum well structure," Journal of Vacuum Science and Technology A: Vaccum, Surfaces and Films, vol. 6, No. 3, pp. 1950-1952 (1988).

Hernández, F. E. et al., "High Performance Optical Limiter," accessed at http://web.archive.org/web/20050429144449/http://www.ieee.org/organizations/pubs/newsletters/leos/dec00/high.htm, accessed on May 7, 2012, pp. 5.

Shakya, J., et al., "Switching characteristics of III-Nitride blue/green micro-LEDs," The Smithsonian/NASA Astrophysics Data System, American Physical Society, Annual March Meeting, March 12-16, 2001.

S. X. Jin, et al., "Size dependence of III-nitride microdisk light-emitting diode characteristics," Applied Physics Letters, May 28, 2001, vol. 78, No. 22, pp. 3532-3534.

International Search Report and Written Opinion for International Application No. PCT/KR2010/002649, mailed on Jul. 26, 2010.

International Search Report and Written Opinion for International Application No. PCT/KR2010/005600, mailed on Oct. 22, 2010.

International Search Report and Written Opinion for International Application No. PCT/KR2010/008118, mailed on Feb. 11, 2011.

U.S. Appl. No. 12/498,204, mailed Mar. 26, 2012, Notice of Allowance.

U.S. Appl. No. 12/493,800, mailed Jan. 20, 2012, Office Action.

U.S. Appl. No. 12/493,800, mailed Apr. 26, 2012, Office Action.

U.S. Appl. No. 12/545,678, mailed Dec. 16, 2011, Office Action.

U.S. Appl. No. 12/545,678, mailed Jun. 20, 2012, Notice of Allowance.

U.S. Appl. No. 12/606,880, mailed Aug. 31, 2012, Notice of Allowance.

U.S. Appl. No. 13/485,241, filed May 31, 2012, Ahn.

U.S. Appl. No. 12/498,265, mailed Aug. 17, 2012, Office Action.

U.S. Appl. No. 12/498,204, mailed May, 29, 2012, Notice of Allowance.

U.S. Appl. No. 12/498,204, mailed Jul. 4, 2012, Issue Notification.

U.S. Appl. No. 12/498,257, mailed Jul. 3, 2012, Office Action.

U.S. Appl. No. 12/606,880, mailed May 23, 2012, Notice of Allowance.

* cited by examiner

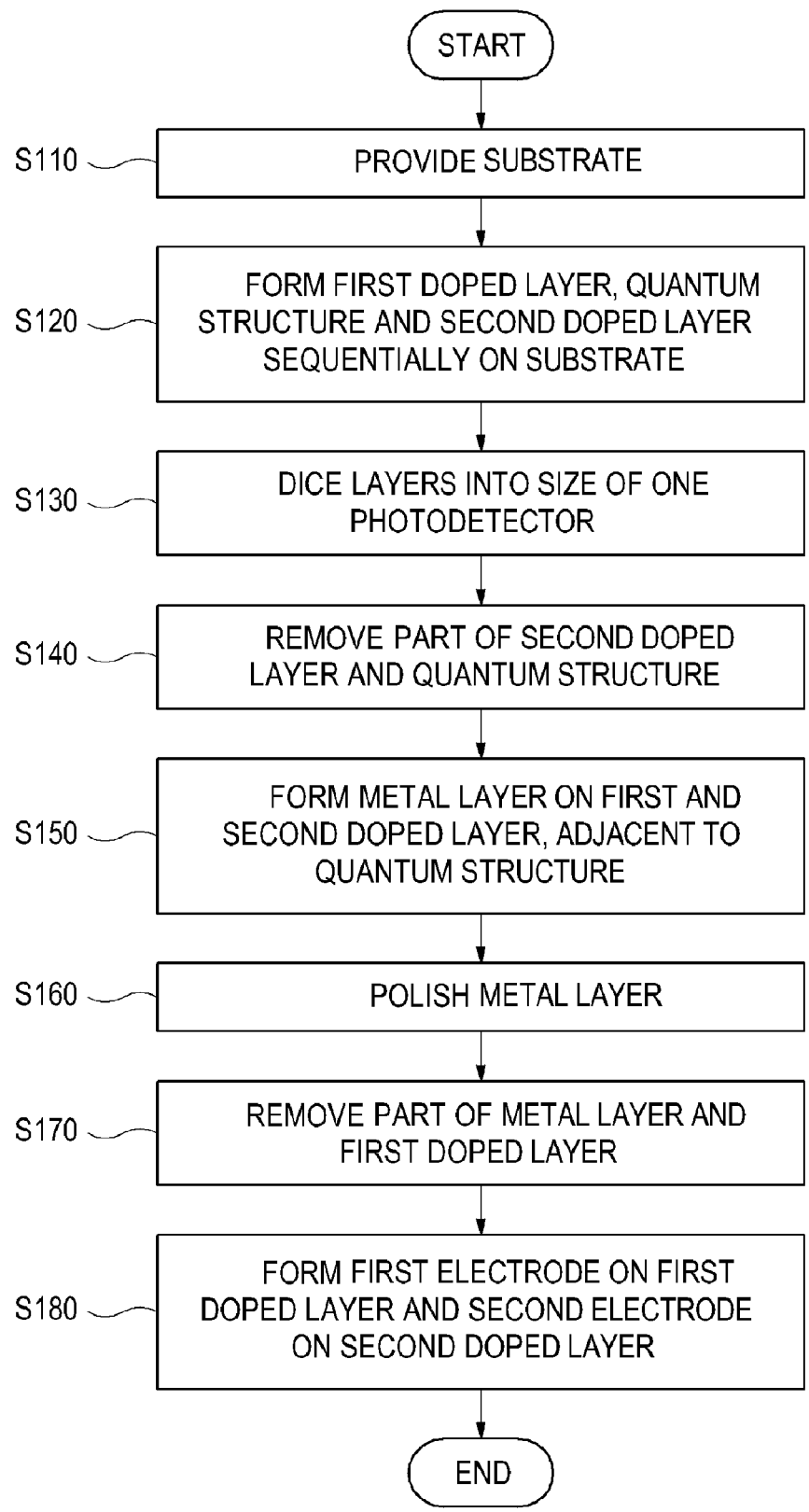

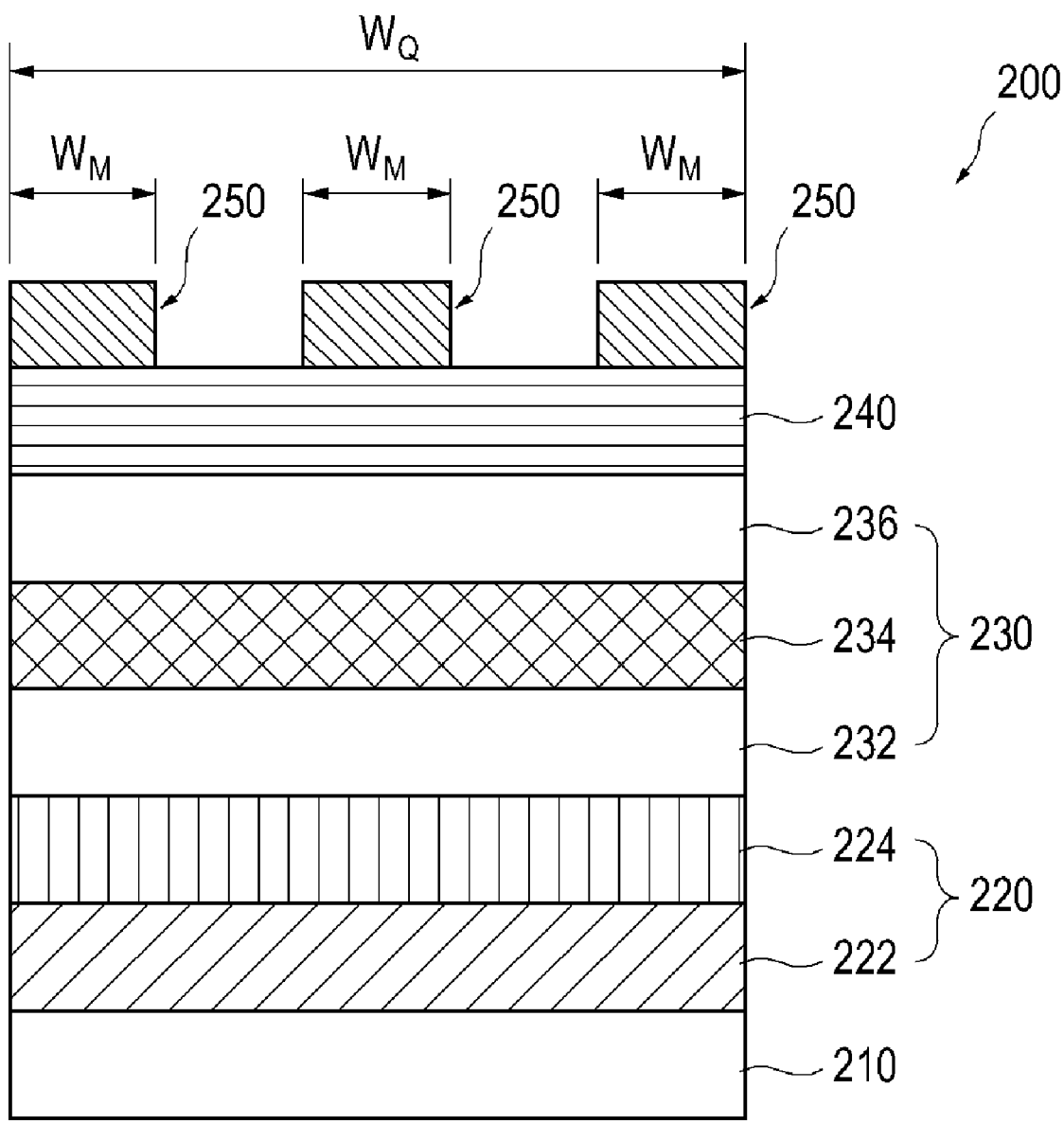

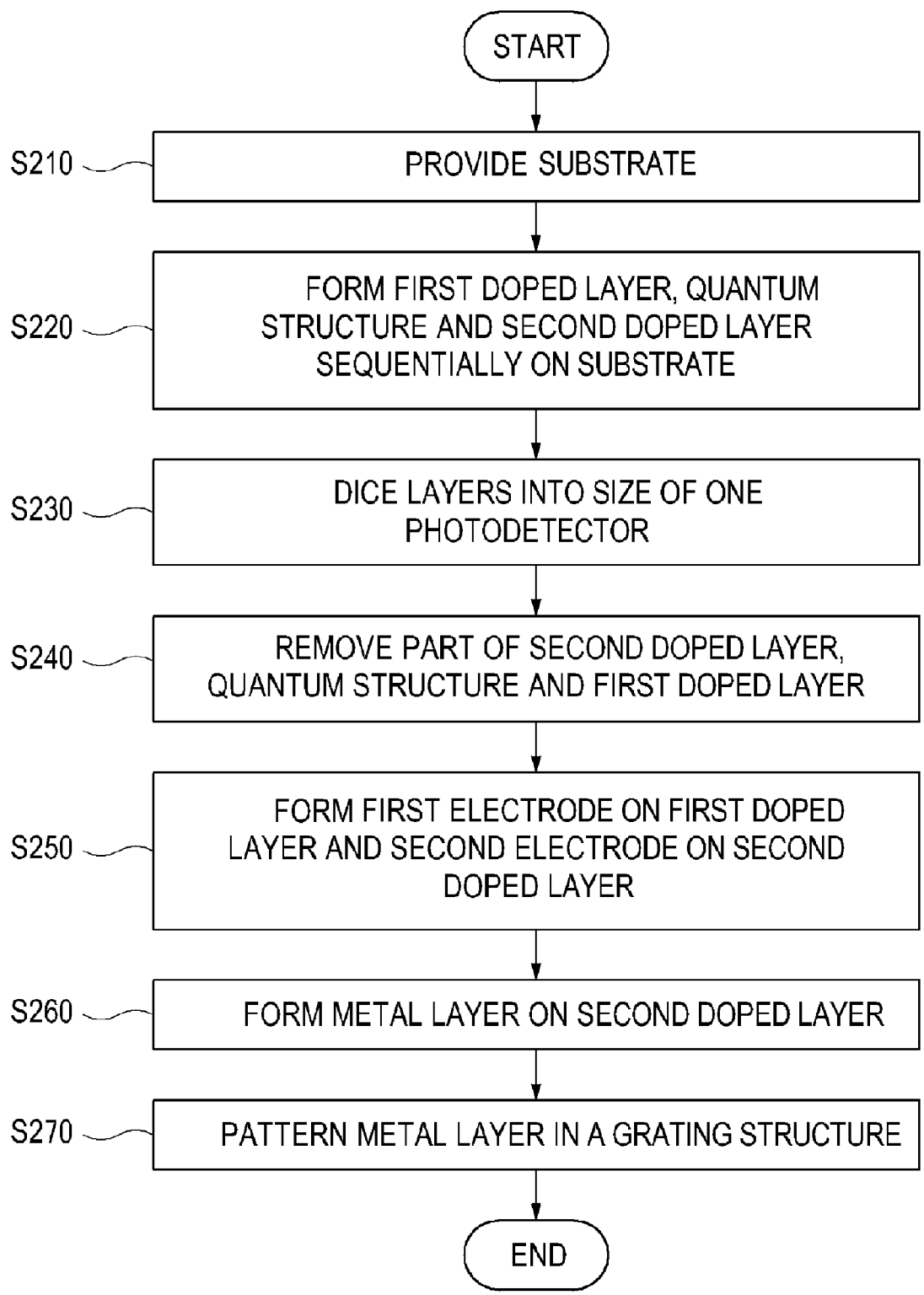

PHOTODETECTORS

CROSS REFERENCE TO RELATED APPLICATION

This application is related to U.S. patent application Ser. No. 12/498,204 filed Jul. 6, 2009 to U.S. patent application Ser. No. 12/498,265 filed Jul. 6, 2009, to U.S. patent application Ser. No. 12/498,257 filed Jul. 6, 2009, and to U.S. patent application Ser. No. 12/498,228 filed Jul. 6, 2009, and to U.S. patent application Ser. No. 12/606,880 filed Oct. 27, 2009.

BACKGROUND

Photodetectors (or photosensors) are sensors capable of detecting light or other electromagnetic energy. This is accomplished by utilizing the interband transition of electrons in a quantum well to detect an energy level of a photon. A quantum well has subbands and when an electron in the quantum well is excited by a photon, the electron jumps to another subband according to the energy level of the photon. When an energy level of a photon is greater than the gap between subband energy levels and the photon enters a quantum well of a photodetector, the electrons in the quantum well become excited and move to an upper subband. In some cases, this movement of excited electrons to the upper subband is described as "tunneling the barrier." Such electron transition causes an electric current through the photodetector.

As nano-photonic devices are increasingly used in various applications (e.g., compact digital cameras), photodetectors for those applications have become smaller than the wavelength of the light to be detected. In this case, the detection efficiency drops very rapidly because the dielectric waveguide structure is inefficient in the sub-wavelength region.

SUMMARY

Various embodiments of photodetectors capable of detecting a photon are disclosed. In one embodiment by way of a non-limiting example, a photodetector includes a quantum structure having a first barrier layer, a well layer located on the first barrier layer and a second barrier layer located on the well layer. A metal layer is located adjacent to the quantum structure.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

FIG. 3 is a flowchart of an illustrative embodiment of a process for fabricating a photodetector.
FIG. 5 is another illustrative embodiment of a photodetector.
FIG. 7 is a flowchart of another illustrative embodiment of a process for fabricating a photodetector.

DETAILED DESCRIPTION

Figure 1:
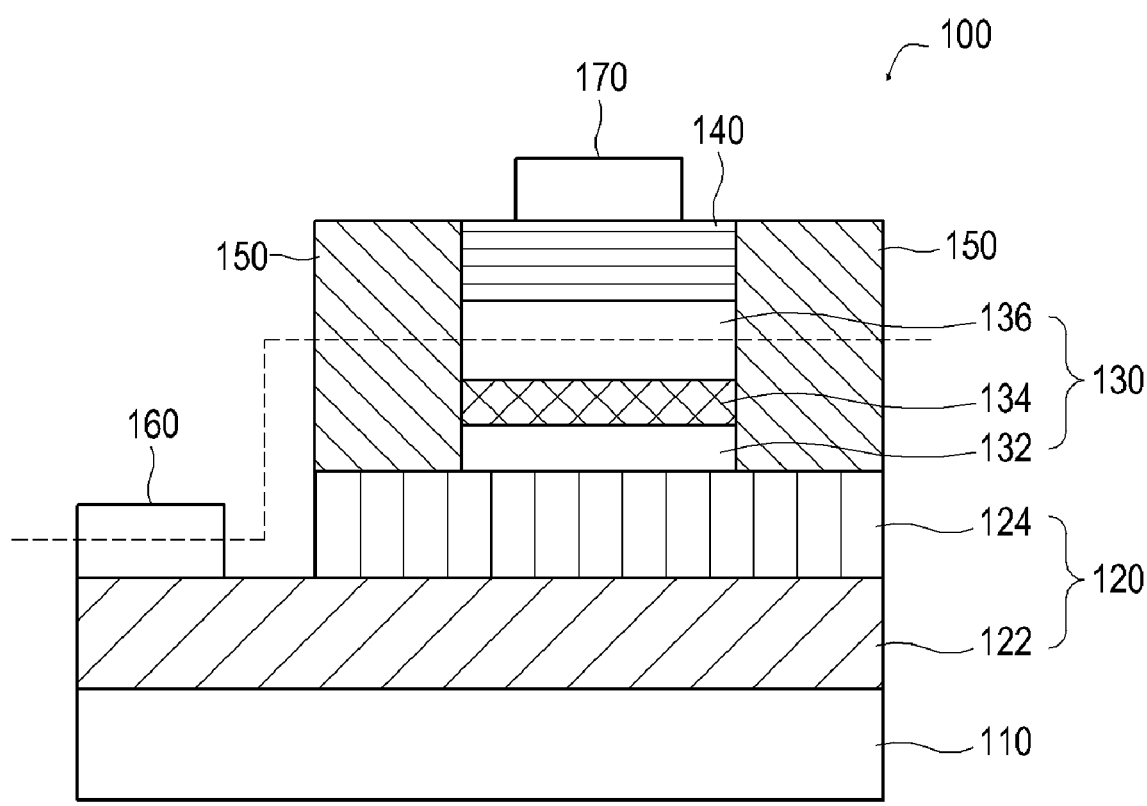
FIG. 1 is an illustrative embodiment of a photodetector.

In the following detailed description, reference is made to the accompanying drawings, which form a part hereof. In the drawings, similar symbols typically identify similar components, unless context dictates otherwise. The illustrative embodiments described in the detailed description, drawings, and claims are not meant to be limiting. Other embodiments may be utilized, and other changes may be made, without departing from the spirit or scope of the subject matter presented herein. It will be readily understood that the aspects of the present disclosure, as generally described herein, and illustrated in the Figures, can be arranged, substituted, combined, and designed in a wide variety of different configurations, all of which are explicitly contemplated herein.

FIG. 1 shows an illustrative embodiment of a photodetector 100. As depicted, photodetector 100 may have a laminated structure in which a substrate 110, a first doped layer 120, a quantum structure 130, and a second doped layer 140 are stacked. In some embodiments, substrate 110, first doped layer 120, quantum structure 130, and second doped layer 140 are sequentially stacked. Quantum structure 130 may include a first barrier layer 132, a second barrier layer 136, and a well layer 134 interposed between first barrier layer 132 and second barrier layer 136. Photodetector 100 may further include a metal layer 150 laterally adjacent to quantum structure 130. In one embodiment, metal layer 150 also may be formed laterally adjacent to second doped layer 140 and formed on first doped layer 120. Photodetector 100 may further include a first electrode 160 on first doped layer 120 and a second electrode 170 on second doped layer 140 through which a predetermined voltage may be applied to photodetector 100. Although quantum structure 130 is depicted as including only one well layer 134 in FIG. 1, quantum structure 130 may include multiple well layers in other embodiments. By way of example, but not in any way limiting, quantum structure 130 may have multiple well structures including two or more well layers having barrier layers on and beneath the well layers; or there may be multiple quantum structures stacked one on top of another or laterally next to each other; or other combinations thereof.

Photodetector 100 may detect a photon with a specific energy level (e.g., light in the blue spectrum) by detecting a certain level of electric current. Electric current may not flow through photodetector 100 even when a power source applies a predetermined voltage to photodetector 100. The electric current may not flow because electrons in well layer 134 do not have enough energy to tunnel barrier layers 132, 136. In one embodiment, if photodetector 100 receives a photon having a sufficient energy level (e.g., light in the blue spectrum), an electron in the ground state in well layer 134 may absorb the energy of the photon and jump to a higher energy state (i.e., higher subband). Electrons in a higher energy state may tunnel through barrier layers 132, 136 to cause electric current through photodetector 100. Accordingly, photodetector 100 may detect a photon having light in the blue spectrum when an electrical current through photodetector 100 is detected.

Quantum structure 130 may be configured to detect a photon with a specific energy level (e.g., light in the blue spectrum). In one embodiment, well layer 134 may include a semiconductor, which has a band gap energy corresponding to the blue spectrum. For example, a semiconductor in well layer 134 may have a band gap energy of about 2.853 eV, which corresponds to the wave length of about 435 nm. For example, a semiconductor in well layer 134 may be selected from one of the following Group II-VI semiconductors such as CdSe, CdS, ZnS, MgSe, MgS, ZnO, MgO, CdO, BeO, CdS, CdSe or compounds thereof. Photodetector 100 can detect light in any spectrum by adjusting semiconductor components in well layer 134 to have a band gap energy corresponding to the light spectrum to be detected. Table 1 below shows examples of Group II-VI semiconductors with its band gap energy (eV), the lattice constant (a-axis) in angstroms (Å), and crystal structure.

TABLE 1

| Group II-VI semiconductors | Band gap energy (eV) | Lattice constant (Å) | Crystal structure |
|---|---|---|---|
| CdSe | 1.732-4.30 | 1.73-4.2999 | Hexagonal |
| CdS | 2.428-4.13 | 2.482-4.135 | hexagonal |
| ZnS | 3.67 | 3.82 | hexagonal |
| MgSe | 4.05 | 4.15 | hexagonal |
| MgS | 4.87 | 5.203 | Rocksalt |
| ZnO | 3.24 | 3.44 | hexagonal |
| MgO | 4.22 | 7.672 | Rocksalt |
| CdO | 4.69 | 2.28 | Rocksalt |
| BeO | 2.698 | 10.585 | hexagonal |

As indicated in Table 1 above, the Group II-VI semiconductors have a band gap energy ranging from about 1.5 eV to about 5.0 eV For example, well layer 134 may include semiconductor compounds whose components are selected from the Group II-VI semiconductors listed in Table 1 to have a band gap energy corresponding to a predetermined spectrum. Compounds including Group II-VI semiconductors with hexagonal crystal structure may have a strong binding energy, which is beneficial in improving quantum efficiency. Further, hexagonal Group II-VI semiconductors are known to be more resistant to the formation of dark spots than cubic Group II-VI semiconductors under high excitation levels. This is because a hexagonal structure is a low-symmetry structure, which suppresses the propagation of defects in devices. For example, assume that a stack fault occurs in a device. If the device is structured symmetrically, the stack fault may propagate easily through the symmetrical structure. However, the stack fault may not propagate and may stop at a certain point in a hexagonal structure or some non-symmetrical structure. Barrier layers 132, 136 may be configured to have an energy band such that carriers such as electrons or holes may be confined in well layer 134. In one embodiment, barrier layers 132, 136 may have a higher conduction band than a conduction band of well layer 134 to confine electrons in well layer 134. In one embodiment, barrier layers 132, 136 may have a lower valence band than a valence band of well layer 134 to confine holes in well layer 134.

In one embodiment, well layer 134 may include CdZnS, which is an alloy of CdS and ZnS. Both CdS and ZnS are direct band gap semiconductors and have a hexagonal crystal structure. The band gap energy of $Cd_xZn_{1-x}S$ may be represented by the following Equation 1.

$$E_g = 3.723 - 1.241x \text{ eV} \quad \text{[Equation 1]}$$

According to Equation 1, when x=0.7, the band gap energy $E_g$ of $Cd_xZn_{1-x}S$ is 2.853 eV, which corresponds to a 435 nm wave length (e.g., blue spectrum). The X in $Cd_xZn_{1-x}S$ which is found in well layer 134 may range from about 0.5 to 1 for blue spectrum detection. In one embodiment, barrier layer 132, 136 may include one of ZnS, MgZnS and CdMgZnS when well layer 134 includes CdZnS.

In another embodiment, well layer 134 may include CdZnO, which is an alloy of CdO and ZnO. Both CdO and ZnO are direct band gap semiconductors. In one embodiment, barrier layer 132, 136 may include one of ZnO, MgZnO and CdMgZnO when well layer 134 includes CdZnO.

Well layer 134 may have a thickness of several nanometers. In some embodiments, the thickness of well layer 134 may be less than about 10 nm or less than about 3 nm. In other embodiments, the thickness of well layer 134 may range from about 1 nm to about 10 nm, from about 2 nm to about 8 nm, or from about 3 nm to about 6 nm. Barrier layers 132, 136 may have a thickness based on the thickness of well layer 134. In one embodiment, the thickness of barrier layers 132, 136 may have a range similar to that of well layer 134. In another embodiment, the thickness of barrier layers 132, 136 may be larger than that of well layer 134 by about 2 nm or less.

Quantum structure 130 may have a width of a several hundred nanometers. In one embodiment, the width of quantum structure 130 may range from about 10 nm to about 1000 nm, about 10 nm to about 500 nm, or about 10 nm to about 100 nm.

In another embodiment, Group II-VI semiconductors included in well layer 134 and barrier layers 132, 136 may have different lattice constants. Differences in the lattice constants of well layer 134 and barrier layers 132, 136, which include Group II-IV semiconductors showing strong piezoelectric effect or spontaneous polarization, may cause strain and/or an electric (polarization) field in well layer 134. The strain and/or an electric field in well layer 134 may degrade overall quantum efficiency in photodetector 100. Quantum structure 130 may be further configured to reduce the strain or electric field in well layer 134. In one embodiment, quantum structure 130 may further include an additional barrier layer positioned between well layer 134 and at least one of barrier layers 132, 136. The additional barrier layer may include the same materials (or semiconductors) as well layer 134. In the additional barrier layer, the composition of the materials may be adjusted to have a proper energy band. In one embodiment, quantum structure 130 may be configured to have a superlattice multilayer, which has multiple well layers and multiple barrier layers. In the superlattice multilayer, each layer may have a thickness of about 1.5 nm or less. In one embodiment, barrier layers 132, 136 may include a quaternary semiconductor compound such as MgCdZnS, MgCdZnO or any compound of four (4) elements selected from the Group II-VI semiconductors. The composition of the quaternary semiconductor compound may be adjusted to reduce the strain or electric field in well layer 134.

Metal layer 150 may serve as a surface plasmon waveguide and concentrate an electric and/or optical field in quantum structure 130. In one embodiment, metal layer 150 may include a metal material with a permittivity larger than the permittivity of quantum structure 130. The relationship of electric fields formed in metal layer 150 and quantum structure 130 may be represented by Equation 2.

$$\frac{D_{x\_quantum}}{D_{x\_metal}} = \frac{\varepsilon_{quantum} E_{x\_quantum}}{\varepsilon_{metal} E_{x\_metal}} = 1 \quad \text{[Equation 2]}$$

$$\therefore \frac{E_{x\_quantum}}{E_{x\_metal}} = \frac{\varepsilon_{metal}}{\varepsilon_{quantum}}$$

where $D_x$ is the electric displacement field along the x axis, $E_x$ is the electric field intensity along the x axis, and $\in$ is permittivity.

According to Equation 2, the permittivity ratio of metal layer 150 to quantum structure 130 is greater than 1. Thus, a stronger electric field and/or optical field may be formed in quantum structure 130. The permittivity ratio of metal layer 150 to quantum layer 130 may range from about 2 to about 100 for a determined spectrum such as wavelengths in the blue spectrum. In one embodiment, the type of metal material included in metal layer 150 may depend on the frequency of a target photon to be confined in the waveguide because the permittivity of a metal is varied depending on the frequency of the photon. In one embodiment, metal layer 150 may include a metal material with a permittivity suitable for blue spectrum detection. For example, metal layer 150 may include one or compounds of Ag, Al, Au, Ni, Ti or any other metal.

Figure 2:
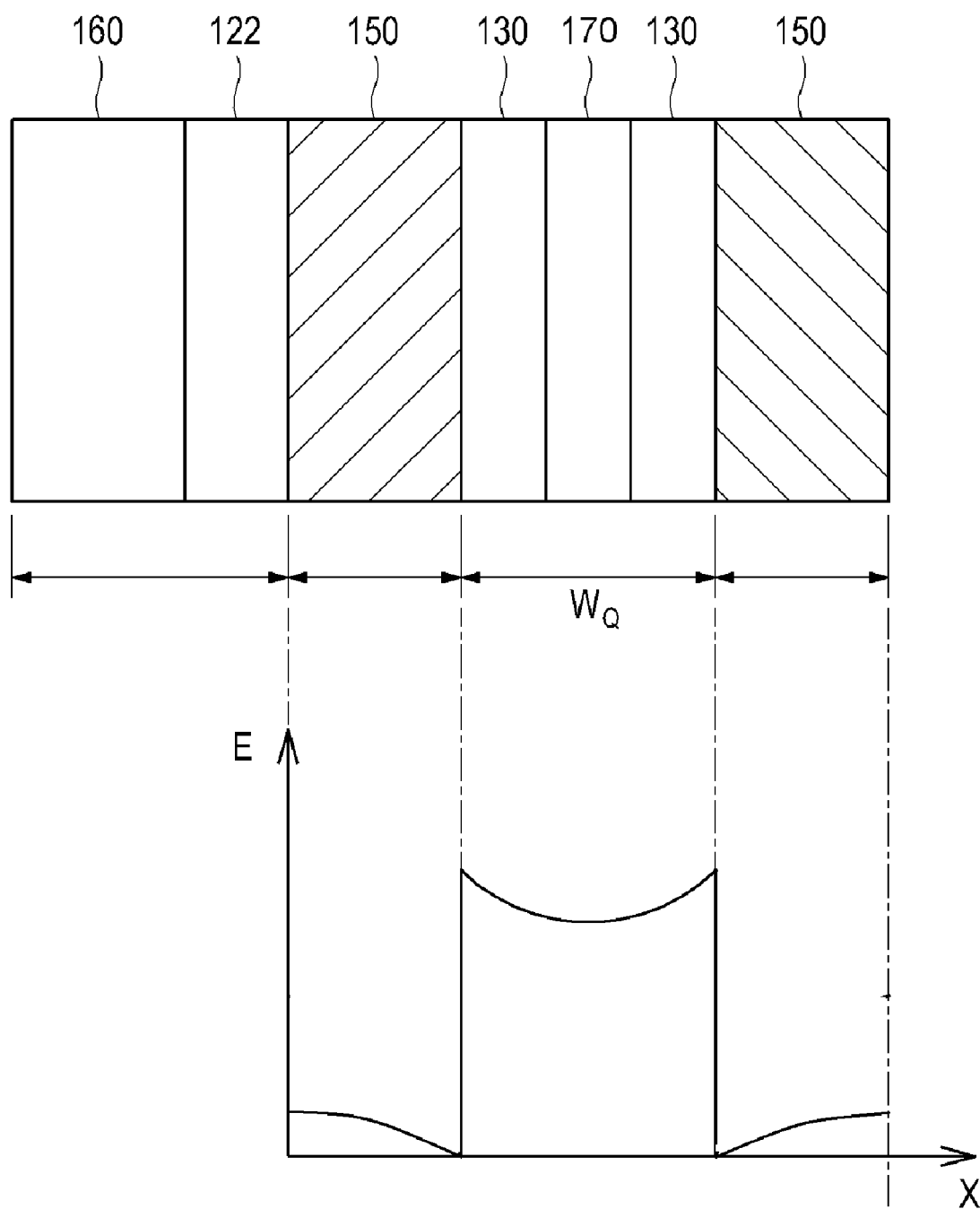
FIG. 2 is a cross sectional view of the photodetector shown in FIG. 1 and electric field therein.

FIG. 2 shows a top view of photodetector 100 shown in FIG. 1 and a graph showing an electric/optical field formed therein. Symbols E, X, $W_Q$ represent an electric and/or optical field formed in a corresponding region, a direction along the width of photodetector 100, and the width of quantum structure 130, respectively. Same numeral references indicate same elements. As shown in FIG. 2, an electric and/or optical field is concentrated on quantum structure 130 since the permittivity ratio of metal layer 150 and quantum structure 130 is greater than 1. Thus, unlike a conventional dielectric waveguide, an electric/optical field may not diffuse to the waveguide (metal layer 150) even if the width $W_Q$ of quantum structure 130 decreases, e.g., down to several hundreds or several tens of nanometers. Therefore, the detection efficiency may not drop although photodetector 100 gets smaller than the wavelength of a photon to be detected.

Metal layer 150 may have a width of several nanometers, several tens of nanometers, or several hundreds of nanometers. In one embodiment, the width of metal layer 150 may range from about 10 nm to about 1000 nm, from about 10 nm to about 500 nm, or from about 10 nm to about 100 nm.

Referring to FIG. 1 again, substrate 110 may include semiconductor substrates suitable for the growth of other layers thereon (i.e., first doped layer 120, quantum structure 130 and second doped layer 140) in the process of fabricating photodetector 100. In one embodiment, substrate 110 may include sapphire when quantum structure 130 includes Group II-VI semiconductors. In another embodiment, substrate 110 may include GaAs (111) or GaAs (001) when quantum structure 130 includes Group II-VI semiconductors. Group II-VI semiconductors may be grown on a GaAs (111) or GaAs (001) substrate because GaAs provides a plane similar to a hexagon along the (111) or (001) direction. Since GaAs is cheaper than sapphire, designers may select GaAs or sapphire for substrate 110 due to, for example, cost limitations.

First doped layer 120 may include n-type semiconductor materials. To form first doped layer 120, an intrinsic layer such as ZnS or ZnO may be grown on substrate 110. Then the intrinsic layer may be doped with an n-type impurity such as Si, Ge, Sn or Te. First doped layer 120 may provide carriers such as electrons to quantum structure 130 and may facilitate an ohmic contact with first electrode 160. In one embodiment, first doped layer 120 may have two or more doped layers including a highly doped layer 122 and a normally doped layer 124 as shown in FIG. 1. Highly doped layer 122 may provide more carriers and good ohmic characteristics while normally doped layer 124 may provide good crystal characteristics to enhance quantum efficiency in quantum structure 130. For example, highly doped layer 122 may have a resistivity ranging from about 0.01 ohm/cm to about 0.1 ohm/cm. Normally doped layer 124 may have, for example, a resistivity higher than about 600 ohm/cm. Second doped layer 140 may include a p-type semiconductor material. To form second doped layer 140, an intrinsic layer such as ZnS may be grown on quantum structure 130. Then the intrinsic layer may be doped with a p-type impurity such as Zn, Mg, Ca or Be. Second doped layer 140 may provide carriers such as holes to quantum structure 130 and may facilitate an ohmic contact with second electrode 170. In one embodiment, second doped layer 140 may have a resistivity higher than about 600 ohm/cm. The types of first and second doped layers 120, 140 may be changed; by way of example, but not limitation, first doped layer 120 may be doped with a p-type impurity, and second doped layer 140 doped with an n-type impurity. In other embodiments first doped layer 20 may be doped with an n-type impurity, and second doped layer 140 doped with a p-type impurity.

Layers 120, 132, 134, 136, 140 in photodetector 100 may be grown using any one of the following procedures including, but not limited to, molecular bean epitaxy (MBE), metalorganic chemical vapor deposition (MOCVD) or numerous other growth methods as appropriate.

In one embodiment, first electrode 160 may have a laminated structure of Ti/Al. While FIG. 1 illustrates an embodiment where a part of quantum structure 130 and second doped layer 140 has been removed to expose a part of first doped layer 120 to form first electrode 160 thereon, various other embodiments are possible. For example, substrate 110 may be removed and first electrode 160 may be formed beneath first doped layer 120.

In one embodiment, second electrode 170 may have a laminated structure of Ni/Au or Ag/Au. In another embodiment, second electrode 170 may include a transparent metal such as indium tin oxide (ITO) for allowing photons or other light to pass through second electrode 170.

Figure 4A:
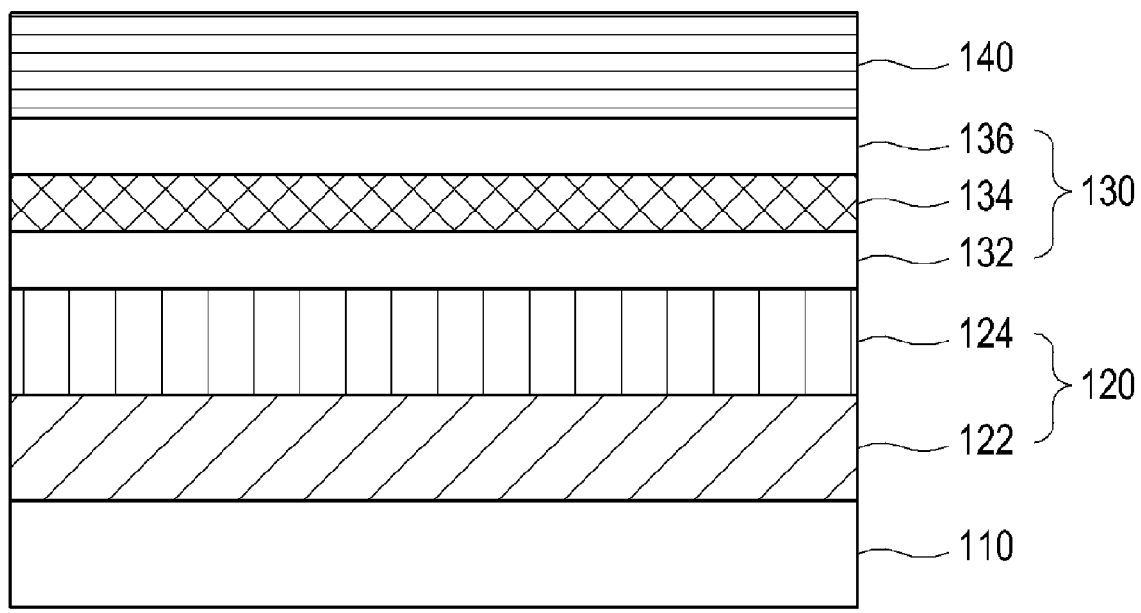
FIG. 4A-FIG. 4E show an illustrative embodiment of a process for making a photodetector.

FIG. 3 is a flowchart of an illustrative embodiment of a process for fabricating a photodetector. For example, process illustrated in FIG. 3 may fabricate photodetector 100 as shown in FIG. 1. Beginning in block S110, a substrate, for example, substrate 110 is provided. In block S120, a first doped layer, a quantum structure and a second doped layer are formed on substrate. In some embodiments this is done sequentially. For example, referring to FIG. 4A, a first doped layer 120, a quantum structure 130 and a second doped layer 140 may be formed sequentially on a substrate 110. As shown in FIG. 4A, quantum structure 130 may include a first barrier 132, a well layer 134 formed on first barrier layer 132 and a second barrier layer 136 formed on well layer 134. Layers 120, 132, 134, 136, 140 may be grown using one of the following methods including, but not limited to, molecular bean epitaxy (MBE), metalorganic chemical vapor deposition (MOCVD) or numerous other growth methods as appropriate.

Quantum structure 130 may be configured to detect a photon with a specific energy level (e.g., light in the blue spectrum). In one embodiment, well layer 134 may include a semiconductor, which has a band gap energy corresponding to the blue spectrum. For example, a semiconductor in well layer 134 may have a band gap energy of about 2.853 eV, which corresponds to a wave length of about 435 nm. For example, semiconductor material included in well layer 134 may be selected from one of following Group II-VI semiconductors including, but not limited to, CdSe, CdS, ZnS, MgSe, MgS, ZnO, MgO, CdO, BeO, CdS, CdSe or compounds thereof. Semiconductor materials (or compounds) in well layer 134 may be selected to have a band gap energy corresponding to the spectrum to be detected by photodetector 100. Barrier layers 132, 136 may be configured to have an energy band such that carriers such as electrons or holes may be confined in well layer 134. In one embodiment, barrier layers 132, 136 may have a higher conduction band than a conduction band of well layer 134 to confine electrons in well layer 134. In one embodiment, barrier layers 132, 136 may have a lower valence band than a valence band of well layer 134 to confine holes in well layer 134. For example, well layer 134 may include CdZnS, which is an alloy of CdS and ZnS. Both of CdS and ZnS are direct band gap semiconductors and have a hexagonal crystal structure, which are suitable for well layer 134. For example, well layer 134 may include CdZnO, which is an alloy of CdO and ZnO. Both CdO and ZnO are direct band gap semiconductors, which are suitable for well layer 134.

Well layer 134 may have a thickness of several nm. In some embodiments, the thickness of well layer 134 may be less than about 10 nm or less than about 3 nm. In one embodiment, the thickness of well layer 134 may range from about 1 nm to about 10 nm, from about 2 nm to about 8 nm, or from about 3 nm to about 6 nm. Barrier layers 132, 136 may have a thickness based on the thickness of well layer 134. In one embodiment, the thickness of barrier layers 132, 136 may have a range similar to that of well layer 134. In one embodiment, the thickness of barrier layers 132, 136 may be larger than that of well layer 134 by about 2 nm or less.

Substrate 110 may include a semiconductor substrate suitable for the growth of other layers thereon (i.e., first doped layer 120, quantum structure 130 and second doped layer 140). In one embodiment, substrate 110 may include sapphire when quantum structure 130 includes Group II-VI semiconductors. In another embodiment, substrate 110 may include GaAs (111) or GaAs (001) when quantum structure 130 includes Group II-VI semiconductors. Group II-VI semiconductors may be grown on GaAs (111) or GaAs (001) substrate because GaAs provides a plate similar to a hexagon along the (111) or (001) direction. Since GaAs is cheaper than sapphire, designers may select GaAs or sapphire for substrate 110 depending on cost.

First doped layer 120 may include n-type semiconductor materials. To form first doped layer 120, an intrinsic layer such as ZnS may be grown on substrate 110. Then the intrinsic layer may be doped with an n-type impurity such as Si, Ge, Sn or Te. First doped layer 120 may provide carriers such as electrons to quantum structure 130 and may facilitate an ohmic contact with first electrode 160. In one embodiment, first doped layer 120 may have two or more doped layers including a highly doped layer 122 and a normally doped layer 124 as shown in FIG. 4A. Highly doped layer 122 may provide more carriers and good ohmic characteristics while normally doped layer 124 may provide good crystal characteristics to enhance quantum efficiency in quantum structure 130. For example, highly doped layer 122 may have a resistivity ranging from about 0.01 ohm/cm to about 0.01 ohm/cm. In another example, normally doped layer 124 may have a resistivity higher than about 600 ohm/cm. Second doped layer 140 may include a p-type semiconductor material. To form second doped layer 140, an intrinsic layer such as ZnS may be grown on quantum structure 130. Then the intrinsic layer may be doped with a p-type impurity such as Zn, Mg, Ca or Be. Second doped layer 140 may provide carriers such as holes to quantum structure 130 and may facilitate an ohmic contact with second electrode 170. In one embodiment, second doped layer 140 may have a resistivity higher than about 600 ohm/cm. The doping types of first and second doped layers 120, 140 may be changed. By way of example, but not limitation, first doped layer 120 may be doped with a p-type impurity, while second doped layer 140 may be doped with an n-type impurity.

Referring again to FIG. 3, in block S130, laminated layers are diced into a size of one photodetector, for example photodetector 100 as shown in FIG. 1. Block S130 is optional and may be omitted if the layers are formed to match the size of photodetector.

Figure 4B:
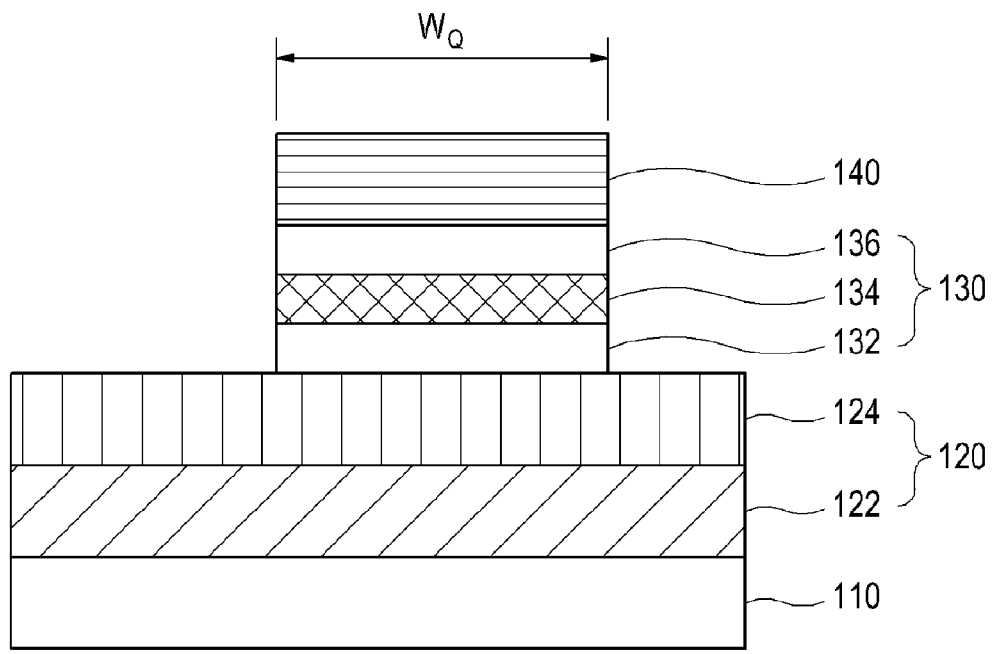

A part of the second doped layer and quantum structure are removed in block S140. For example, referring to FIG. 4B, a part of second doped layer 140 and quantum structure 130 may be removed leaving a structure having a width $W_Q$. In one embodiment, a part of at least one of layers 130, 140 may be removed by dry etching. In one embodiment, the predetermined width $W_Q$ of quantum structure 130 and second doped layer 140 may be several hundred nanometers. For example, the width $W_Q$ may range from about 10 nm to about 1000 nm, from about 10 nm to about 500 nm, or from about 10 nm to about 100 nm.

Figure 4C:
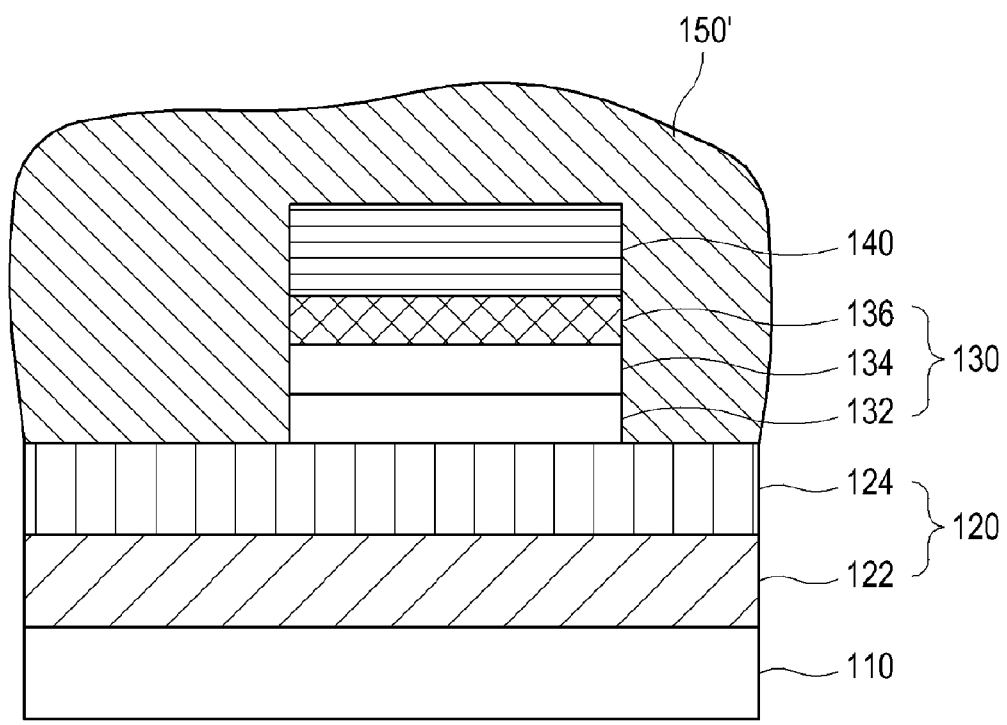

In block S150, a metal layer is formed on first and second doped layers adjacent to the quantum structure formed. For example, referring to FIG. 4C, a metal layer 150' may be formed to cover first doped layer 120, quantum structure 130 and second doped layer 140. In one embodiment, metal layer 150' may be formed by sputtering or vacuum deposition. In another embodiment, metal layer 150' may include any type of metal material with a permittivity larger than the permittivity of quantum structure 130. The permittivity ratio of metal layer 150 to quantum layer 130 may range from about 2 to about 100, which is suitable for detecting a determined spectrum. In one embodiment, the metal material included in metal layer 150 may depend on the frequency of a photon to be detected because the permittivity of a metal varies depending on the frequency. In one embodiment, metal layer 150 may include a metal with a permittivity suitable for blue spectrum detection. For example, metal layer 150 may include one of Ag, Al, Au, Ni, Ti or any other metal or compounds thereof.

Figure 4D:
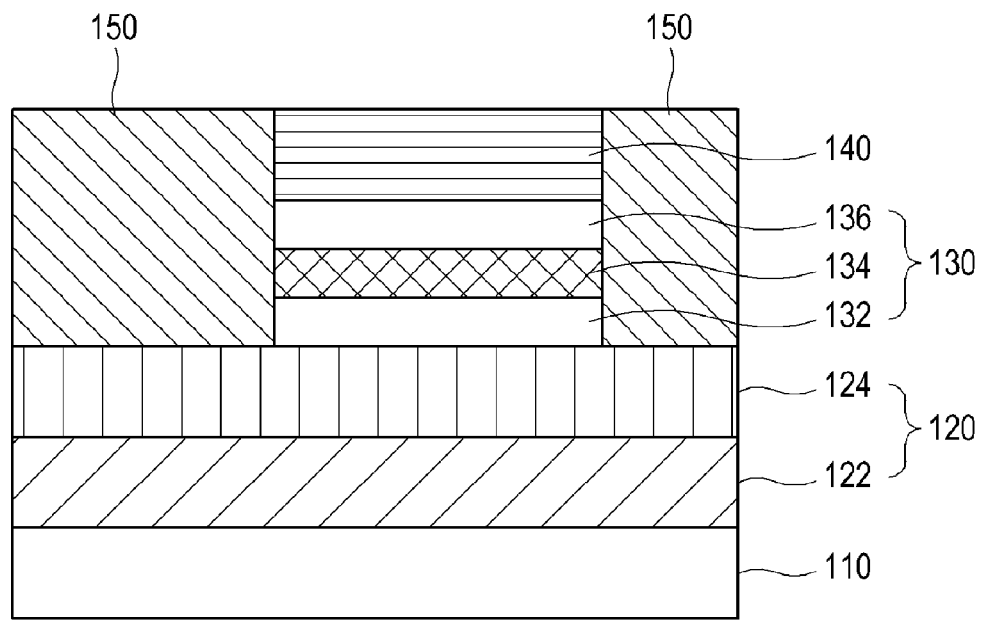

In block S160, a metal layer is polished. For example referring to FIG. 4D, metal layer 150' illustrated in FIG. 4C may be polished such that its surface may be substantially level with second doped layer 140 thereby forming metal layer 150. In one embodiment, polishing may be performed mechanically or chemically.

Figure 4E:
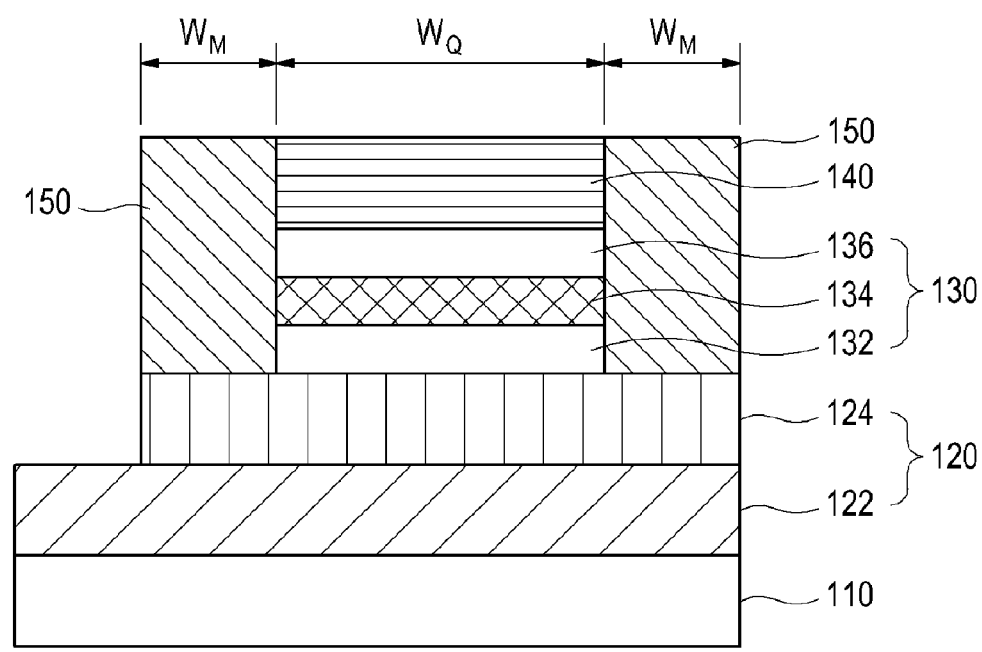

In block S170, a part of the metal layer and first doped layer is removed. For example, referring to FIG. 4E, a part of metal layer 150 and first doped layer 120 may be removed to expose a part of first doped layer 120 and to leave metal layer 150 having width $W_M$. In one embodiment, a part of highly doped layer 122 of first doped layer 120 may be removed to expose a part of normally doped layer 124 of first doped layer 120. In another embodiment, a part of highly doped layer 122 may be removed to expose a remaining part thereof as shown in FIG. 4E. In another embodiment, a part of normally doped layer 124 may be removed to expose a remaining part thereof. Metal layer 150 may have a width $W_M$ of several nanometers, several tens of nanometers, or several hundreds of nanometers. In one embodiment, the width $W_M$ of metal layer 150 may range from about 10 nm to about 1000 nm, from about 10 nm to about 500 nm, or from about 10 nm to about 100 nm. Metal layer 150 may serve as a plasmon waveguide and concentrate an electric and/or optical field in quantum structure 130.

In block S180, a first electrode and a second electrode are formed on an exposed portion of a first doped layer and on a second doped layer, respectively. For example referring to FIG. 1, first electrode 160 and second electrode 170 may be formed on an exposed portion of first doped layer 120 and on second doped layer 140, respectively. In one embodiment, a first electrode may have a laminated structure of Ti/Al. In another embodiment, a second electrode may have a laminated structure of Ni/Au or Ag/Au. In another embodiment, the second electrode may include a transparent metal such as indium tin oxide (ITO) allowing photons or other light to pass through the second electrode.

One skilled in the art will appreciate that, for this and other processes and methods disclosed herein, the functions performed in the processes and methods may be implemented in differing order. Furthermore, the outlined steps and operations are only provided as examples, and some of the steps and operations may be optional, combined into fewer steps and operations, or expanded into additional steps and operations without detracting from the essence of the disclosed embodiments.

FIG. 5 shows an illustrative embodiment of a photodetector 200. As depicted, photodetector 200 may have a laminated structure having a substrate 210, a first doped layer 220 located on substrate 220, a quantum structure 230 located on first doped layer 220, and a second doped layer 240 located on quantum structure quantum structure 230. In some embodiments, substrate 210, first doped layer 220, quantum structure 230, and second doped layer 240 are sequentially stacked. Quantum structure 230 may include a first barrier layer 232, a second barrier layer 236, and a well layer 234 interposed between first barrier layer 232 and second barrier layer 236. Photodetector 200 may further include a metal layer 250 over quantum structure 230. Width $W_M$ of metal layer 250 may be less than width $W_Q$ of quantum structure 230. In one embodiment, metal layer 250 may be formed on second doped layer 240 as shown in FIG. 2. In another embodiment, two or more metal layers 250 may be positioned on second doped layer 240 to form a grating. As shown in FIG. 5, first doped layer 220 may include a highly doped layer 222 and a normally doped layer 224.

Although not shown in FIG. 5, in some embodiments, photodetector 200 may further include a first electrode on first doped layer 220 and a second electrode on second doped layer 240 so that photodetector 200 can receive a predetermined voltage from an outside power source. Although quantum structure 230 is depicted as including only one well layer 234 in FIG. 5, quantum structure 230 may include multiple well layers in other embodiments. By way of example, but not in any way limiting, quantum structure 230 may have multiple well structures including two or more well layers having barrier layers on and beneath the well layers; or there may be multiple quantum structures stacked one on top of another; or laterally next to each other; or other combinations thereof.

In one embodiment, layers 210, 222, 224, 232, 234, 236, 240, 250 may include materials similar to layers 110, 122, 124, 132, 134, 136, 140, 150 as shown in FIG. 1, respectively. In one embodiment, well layer 234 may include a semiconductor, which has a band gap energy corresponding to the blue spectrum. For example, a semiconductor in well layer 234 may have a band gap energy of about 2.853 eV which corresponds to a wave length of about 435 nm. In one embodiment, a semiconductor material included in well layer 234 may be selected from one of the Group II-VI semiconductors such as CdSe, CdS, ZnS, MgSe, MgS, ZnO, MgO, CdO, BeO, CdS, CdSe or compounds thereof.

In another embodiment, the width $W_Q$ of quantum structure 230 may be several hundred nanometers. For example, the width $W_Q$ may range from about 10 nm to about 1000 nm, from about 10 nm to about 500 nm, or from about 10 nm to about 100 nm. In another embodiment, the width $W_M$ of metal layer 250 may be several tens of nanometers. For example, the width $W_M$ may range from about 1 nm to about 100 nm, from about 2 nm to about 50 nm, or from about 5 nm to about 10 nm. The number or width, $W_M$, of metal layers 250 may be determined depending on process complexity and cost limitations.

In one embodiment, layers 210, 220, 230, 240 may have a thickness similar to layers 110, 120, 130, 140 as shown in FIG. 1, respectively. In another embodiment, layers 210, 220, 230, 240 may be formed in a similar manner to layers 110, 120, 130, 140 as shown in FIG. 1, respectively.

Figure 6:
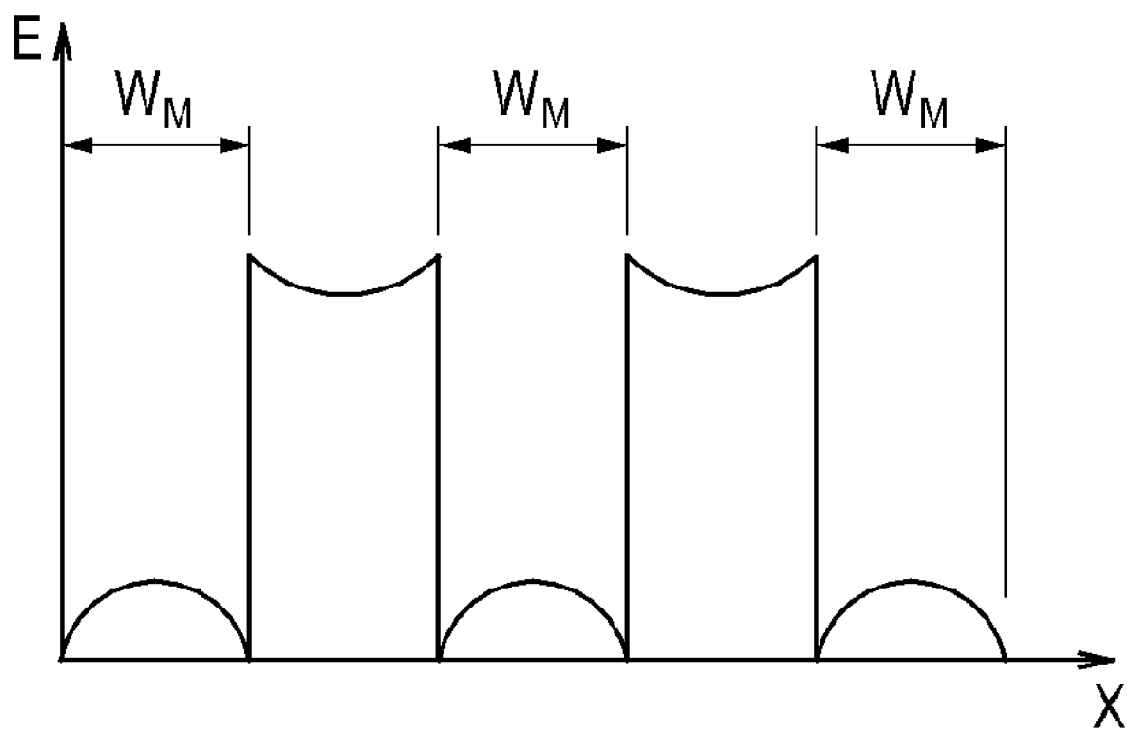
FIG. 6 is an illustration of an electric/optical field formed in the photodetector illustrated in FIG. 5.

FIG. 6 is a graph of an electric/optical field formed in photodetector 200 shown in FIG. 5. The E axis represents the electric/optical field formed on photodetector 200, the X axis represents the position on the photodetector, and $W_M$ is the width of metal layer 250. As shown in FIG. 6, the electric and/or optical field is concentrated inside quantum structure 230 since the permittivity ratio of metal layer 250 and quantum structure 230 is greater than 1. Thus, unlike conventional dielectric waveguides, the electric/optical field may not diffuse to the waveguide (metal layer 250) even if the width $W_Q$ of quantum structure 130 decreases, e.g., down to several hundreds or several tens of nanometers. Therefore, the detection efficiency may not drop although photodetector 200 gets smaller than the wavelength of a photon to be detected.

FIG. 7 is a flowchart of an illustrative embodiment of a process for fabricating a photodetector. For example, photodetector 200 as shown in FIG. 5 may be fabricated using the process illustrated in FIG. 7. Beginning in block S210, a substrate (for example, substrate 210 as shown in FIG. 5) is provided. In block S220, a first doped layer, a quantum structure and a second doped layer are formed on the substrate. In some embodiments this is done sequentially. For example, referring to FIG. 5, first doped layer 220, quantum structure 230 and second doped layer 240 may be formed sequentially on substrate 210. As shown in FIG. 5, quantum structure 230 may include first barrier 232, well layer 234 formed on first barrier layer 232 and second barrier layer 236 formed on well layer 234. First doped layers 220 may include highly doped layer 222 and normally doped layer 224 as shown in FIG. 5. Layers 222, 224, 232, 234, 236, 240 may be grown by any of the following methods including, but not limited to, molecular bean epitaxy (MBE), metalorganic chemical vapor deposition (MOCVD) or numerous other growth methods as appropriate. Layers 222, 224, 232, 234, 236, 240 may include materials similar to layers 122, 124, 132, 134, 136, 140 as shown in FIG. 1, respectively.

In block S230, laminated layers are diced into a size of one photodetector, for example, photodetector 200 as shown in FIG. 5. Block S230 is optional and may be omitted if the layers are formed to match the size of the photodetector.

In block S240, a part of the second doped layer, the quantum structure and the first doped layer are removed to expose a part of the first doped layer. For example, referring to FIG. 5, a part of second doped layer 240, quantum structure 230 and first doped layer 220 may be removed to leave a structure having a width $W_Q$. In one embodiment, width $W_Q$ of the remaining second doped layer, quantum structure and first doped layer may be several hundred nanometers. For example, the width $W_Q$ may range from about 10 nm to about 1000 nm, from about 10 nm to about 500 nm, or from about 10 nm to about 100 nm. In block S250, a first electrode and a second electrode are formed on the first doped layer and on the second doped layer, respectively. In some embodiments, block S250 may be performed later.

In block S260, a metal layer is formed on the second doped layer. For example, referring to FIG. 5, metal layer 250 may be formed on second doped layer 240. In one embodiment, metal layer 250 may include materials similar to metal layer 150 shown in FIG. 1. In block S270, the metal layer is patterned to form a grating structure, for example, such as metal layer 250 shown in FIG. 5. In one embodiment, the width $W_M$ of the metal layer may be several tens of nanometers. For example, the width $W_M$ may range from about 1 nm to about 100 nm, from about 2 nm to about 50 nm, or from about 5 nm to about 10 nm. The number or width $W_M$ of the metal layers may be determined depending on process complexity and cost limitations.

The order of the operations may be changed depending on design options. For example, blocks S260 and S270 may be performed before blocks S240 and S250.

The present disclosure is not to be limited in terms of the particular embodiments described in this application, which are intended as illustrations of various aspects. Many modifications and variations can be made without departing from its spirit and scope, as will be apparent to those skilled in the art. Functionally equivalent methods and apparatuses within the scope of the disclosure, in addition to those enumerated herein, will be apparent to those skilled in the art from the foregoing descriptions. Such modifications and variations are intended to fall within the scope of the appended claims. The present disclosure is to be limited only by the terms of the appended claims, along with the full scope of equivalents to which such claims are entitled. It is to be understood that this disclosure is not limited to particular methods, reagents, compounds compositions or biological systems, which can, of course, vary. It is also to be understood that the terminology used herein is for the purpose of describing particular embodiments only, and is not intended to be limiting.

With respect to the use of substantially any plural and/or singular terms herein, those having skill in the art can translate from the plural to the singular and/or from the singular to the plural as is appropriate to the context and/or application. The various singular/plural permutations may be expressly set forth herein for sake of clarity.

It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," etc.). It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to embodiments containing only one such recitation, even when the same claim includes the introductory phrases "one or more" or "at least one" and indefinite articles such as "a" or "an" (e.g., "a" and/or "an" should be interpreted to mean "at least one" or "one or more"); the same holds true for the use of definite articles used to introduce claim recitations. In addition, even if a specific number of an introduced claim recitation is explicitly recited, those skilled in the art will recognize that such recitation should be interpreted to mean at least the recited number (e.g., the bare recitation of "two recitations," without other modifiers, means at least two recitations, or two or more recitations). Furthermore, in those instances where a convention analogous to "at least one of A, B, and C, etc." is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, etc.). In those instances where a convention analogous to "at least one of A, B, or C, etc." is used, in general such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, etc.). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

In addition, where features or aspects of the disclosure are described in terms of Markush groups, those skilled in the art will recognize that the disclosure is also thereby described in terms of any individual member or subgroup of members of the Markush group.

As will be understood by one skilled in the art, for any and all purposes, such as in terms of providing a written description, all ranges disclosed herein also encompass any and all possible subranges and combinations of subranges thereof. Any listed range can be easily recognized as sufficiently describing and enabling the same range being broken down into at least equal halves, thirds, quarters, fifths, tenths, etc. As a non-limiting example, each range discussed herein can be readily broken down into a lower third, middle third and upper third, etc. As will also be understood by one skilled in the art all language such as "up to," "at least," and the like include the number recited and refer to ranges which can be subsequently broken down into subranges as discussed above. Finally, as will be understood by one skilled in the art, a range includes each individual member. Thus, for example, a group having 1-3 cells refers to groups having 1, 2, or 3 cells. Similarly, a group having 1-5 cells refers to groups having 1, 2, 3, 4, or 5 cells, and so forth.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

The invention claimed is:

1. A device comprising:
   a quantum structure comprising:
      a first barrier layer;
      a well layer located on the first barrier layer; and
      a second barrier layer located on the well layer; and
   a metal layer located adjacent to and in direct contact with the first barrier layer, well layer and second barrier layer of the quantum structure.

2. The device of claim 1, wherein the quantum structure comprises a Group II-VI semiconductor.

3. The device of claim 2, wherein the Group II-VI semiconductor is a hexagonal structure.

4. The device of claim 1, wherein the well layer comprises $Cd_xZn_{1-x}S$ wherein x ranges from about 0.5 to about 1.

5. The device of claim 1, wherein the first and second barrier layers comprise a semiconductor selected from the group consisting essentially of ZnS, MgZnS, MgCdZnS, ZnO, MgZnO and MgCdZnO.

6. The device of claim 1, wherein the quantum structure has a width less than about 100 nm, and the metal layer has a width less than about 100 nm.

7. The device of claim 1, wherein the metal layer comprises metal material selected from the group consisting essentially of Ag, Al, Au, Ni and Ti.

8. The device of claim 1, further comprising:
a first doped layer located beneath the first barrier layer; and
a second doped layer located on the second barrier layer, wherein the metal layer is located on the first doped layer and adjacent to the second doped layer.

9. The device of claim 8, further comprising:
a substrate located beneath the first doped layer.

10. The device of claim 9, wherein the substrate comprises GaAs.

11. The device of claim 1, wherein the metal layer is laterally adjacent to both sides of the quantum structure.

12. The device of claim 1, wherein the well layer has electrons on subbands such that one or more transitions between the subbands correspond to a photon with a blue spectrum.

13. A device comprising:
a quantum structure comprising:
a first barrier layer;
a well layer located on the first barrier layer; and
a second barrier layer located on the well layer; and
a metal layer comprising a surface plasmon waveguide configured to concentrate an electric and optical field in the quantum structure, wherein the metal layer is positioned laterally adjacent to and in direct contact with the first barrier layer, well layer and second barrier layer.

14. The device of claim 13, further comprising a doped layer formed on the quantum structure, wherein the metal layer is formed on the doped layer above the quantum structure.

15. The device of claim 13, further comprising:
a first doped layer located beneath the first barrier layer; and
a second doped layer located on the second barrier layer, wherein the metal layer is located on the first doped layer and adjacent to the second doped layer.

16. The device of claim 13, wherein the quantum structure comprises a Group II-VI semiconductor.

17. The device of claim 16, wherein the Group II-VI semiconductor is a hexagonal structure.

18. The device of claim 13, wherein the first and second barrier layers comprise a semiconductor selected from the group consisting essentially of ZnS, MgZnS, MgCdZnS, ZnO, MgZnO and MgCdZnO.

19. A device comprising:
a quantum structure comprising:
a first barrier layer;
a well layer located on the first barrier layer; and
a second barrier layer located on the well layer;
a metal layer located laterally adjacent to and in direct contact with the both sides of the first barrier layer, well layer and second barrier layer of the quantum structure;
a first doped layer located beneath the first barrier layer;
a second doped layer located on the second barrier layer, wherein the metal layer is located on the first doped layer and adjacent to the second doped layer; and
a substrate located beneath the first doped layer.

20. The device of claim 19, wherein the first and second barrier layers comprise a semiconductor selected from the group consisting essentially of ZnS, MgZnS, MgCdZnS, ZnO, MgZnO and MgCdZnO.

21. A method comprising:
forming a quantum structure by:
forming a first barrier layer;
forming a well layer on the first barrier layer; and
forming a second barrier layer on the well layer;
removing a part of the quantum structure until the quantum structure has a predetermined width; and
forming a metal layer laterally adjacent to and in direct contact with the first barrier layer, the well layer, and the second barrier layer of the quantum structure.

22. The method of claim 21, further comprising:
forming a first doped layer wherein forming a first barrier layer comprises forming a first barrier layer on the first doped layer; and
forming a second doped layer on the second barrier layer, wherein
removing a part of the quantum structure further comprises removing a part of the quantum structure corresponding to the second doped layer so that the second doped layer has the same width as the quantum structure, and
forming a metal layer further comprises forming a metal layer on the first doped layer adjacent to the quantum structure and the second doped layer.

23. The method of claim 22, further comprising:
providing a substrate, wherein forming the first doped layer comprises forming the first doped layer on the substrate.

24. The method of claim 21, wherein forming the metal layer comprises forming a metal layer laterally adjacent to both sides of the quantum structure.

25. The method of claim 21, wherein the well layer has electrons on subbands such that one or more transitions between the subbands correspond to a photon with a blue spectrum.

26. The method of claim 21, wherein the metal layer has a width less than a width of the quantum structure.

* * * * *

UNITED STATES PATENT AND TRADEMARK OFFICE
CERTIFICATE OF CORRECTION

PATENT NO. : 8,373,153 B2
APPLICATION NO. : 12/472168
DATED : February 12, 2013
INVENTOR(S) : Ahn It is certified that error appears in the above-identified patent and that said Letters Patent is hereby corrected as shown below:

On the Title Page, in Item (56), under "OTHER PUBLICATIONS", in Column 2, Line 1, delete "al" and insert -- al., --, therefor.

On the Title Page, in Item (56), under "OTHER PUBLICATIONS", in Column 2, Line 2, delete "Well"" and insert -- Well," --, therefor.

On the Title Page, in Item (56), under "OTHER PUBLICATIONS", in Column 2, Line 3, delete "2006" and insert -- 2006, --, therefor.

Title Page 2, in Item (56), under "OTHER PUBLICATIONS", in Column 1, Line 1, delete "al" and insert -- al., --, therefor.

Title Page 2, in Item (56), under "OTHER PUBLICATIONS", in Column 1, Line 2, delete "Grooves"" and insert -- Grooves," --, therefor.

Title Page 2, in Item (56), under "OTHER PUBLICATIONS", in Column 1, Line 4, delete "al" and insert -- al., --, therefor.

Title Page 2, in Item (56), under "OTHER PUBLICATIONS", in Column 1, Line 5, delete "superlattices" Journal of Crystal Growth 184/185 (1998)" and insert -- superlattices," Journal of Crystal Growth 184/185, (1998), --, therefor.

Title Page 2, in Item (56), under "OTHER PUBLICATIONS", in Column 1, Line 7, delete "al" and insert -- al., --, therefor.

Title Page 2, in Item (56), under "OTHER PUBLICATIONS", in Column 1, Lines 9-10, delete "substrates" Journal of Crystal Growth 214/215 (2000) pp." and insert -- substrates," Journal of Crystal Growth 214/215, (2000), pp. --, therefor.

Signed and Sealed this
Eleventh Day of June, 2013

Teresa Stanek Rea
*Acting Director of the United States Patent and Trademark Office*

CERTIFICATE OF CORRECTION (continued)
U.S. Pat. No. 8,373,153 B2

Title Page 2, in Item (56), under "OTHER PUBLICATIONS", in Column 1, Line 11, delete "al" and insert -- al., --, therefor.

Title Page 2, in Item (56), under "OTHER PUBLICATIONS", in Column 1, Line 13, delete "MOVPE" Physica E, vol. 17 (2003)" and insert -- MOVPE," Physica E, vol. 17, (2003), --, therefor.

Title Page 2, in Item (56), under "OTHER PUBLICATIONS", in Column 1, Line 14, delete "al" and insert -- al., --, therefor.

Title Page 2, in Item (56), under "OTHER PUBLICATIONS", in Column 1, Line 15, delete "applications"" and insert -- applications," --, therefor.

Title Page 2, in Item (56), under "OTHER PUBLICATIONS", in Column 1, Line 16, delete "2006" and insert -- 2006, --, therefor.

Title Page 2, in Item (56), under "OTHER PUBLICATIONS", in Column 1, Line 17, delete "al" and insert -- al., --, therefor.

Title Page 2, in Item (56), under "OTHER PUBLICATIONS", in Column 1, Lines 17-18, delete "integration" Optics Express, vol. 13, No. 17, Aug. 22, 2005" and insert -- integration," Optics Express, vol. 13, No. 17, Aug. 22, 2005, --, therefor.

Title Page 2, in Item (56), under "OTHER PUBLICATIONS", in Column 1, Line 19, delete "al" and insert -- al., --, therefor.

Title Page 2, in Item (56), under "OTHER PUBLICATIONS", in Column 1, Lines 20-21, delete "coupling" Physical Review B, vol. 66 (2002)" and insert -- coupling," Physical Review B, vol. 66, (2002), --, therefor.

Title Page 2, in Item (56), under "OTHER PUBLICATIONS", in Column 1, Line 22, delete "al" and insert -- al., --, therefor.

Title Page 2, in Item (56), under "OTHER PUBLICATIONS", in Column 1, Line 23, delete "wells"" and insert -- wells," --, therefor.

Title Page 2, in Item (56), under "OTHER PUBLICATIONS", in Column 1, Line 25, delete "al" and insert -- al., --, therefor.

Title Page 2, in Item (56), under "OTHER PUBLICATIONS", in Column 1, Lines 26-27, delete "lasers" Applied Physics Letters, vol. 87, 253509 (2005)" and insert -- lasers," Applied Physics Letters, vol. 87, (2005), --, therefor.

Title Page 2, in Item (56), under "OTHER PUBLICATIONS", in Column 2, Line 1, delete "al" and insert -- al., --, therefor.

CERTIFICATE OF CORRECTION (continued)
U.S. Pat. No. 8,373,153 B2

Title Page 2, in Item (56), under "OTHER PUBLICATIONS", in Column 2, Lines 2-3, delete "field" Applied Physics Letters, vol. 92, 171115 (2008)" and insert -- field," Applied Physics Letters, vol. 92, (2008), --, therefor.

Title Page 2, in Item (56), under "OTHER PUBLICATIONS", in Column 2, Line 4, delete "al" and insert -- al., --, therefor.

Title Page 2, in Item (56), under "OTHER PUBLICATIONS", in Column 2, Lines 5-6, delete "sensors" Phys. Stat. Sol. (c) 3, No. 4, pp. 1225-1228 (2006)." and insert -- sensors," Phys. Stat. Sol. (c) 3, No. 4, pp. 1225-1228, (2006). --, therefor.

Title Page 2, in Item (56), under "OTHER PUBLICATIONS", in Column 2, Line 50, delete "al" and insert -- al., --, therefor.

Title Page 2, in Item (56), under "OTHER PUBLICATIONS", in Column 2, Line 51, delete "experiment"" and insert -- experiment," --, therefor.

Title Page 2, in Item (56), under "OTHER PUBLICATIONS", in Column 2, Line 53, delete "al" and insert -- al., --, therefor.

Title Page 2, in Item (56), under "OTHER PUBLICATIONS", in Column 2, Lines 54-55, delete "lasers" Applied Physics Letters" and insert -- lasers," Applied Physics Letters, --, therefor.

Title Page 2, in Item (56), under "OTHER PUBLICATIONS", in Column 2, Line 57, delete "al" and insert -- al., --, therefor.

Title Page 2, in Item (56), under "OTHER PUBLICATIONS", in Column 2, Line 59, delete "experiment" Applied Physics Letters 87, 044103" and insert -- experiment," Applied Physics Letters, 87, 044103-044103-3, --, therefor.

Title Page 2, in Item (56), under "OTHER PUBLICATIONS", in Column 2, Line 61, delete "al" and insert -- al., --, therefor.

Title Page 2, in Item (56), under "OTHER PUBLICATIONS", in Column 2, Line 62, delete "Confinement"" and insert -- Confinement," --, therefor.

Title Page 2, in Item (56), under "OTHER PUBLICATIONS", in Column 2, Line 64, delete "al" and insert -- al., --, therefor.

Title Page 2, in Item (56), under "OTHER PUBLICATIONS", in Column 2, Line 65, delete "Effects"" and insert -- Effects," --, therefor.

Title Page 2, in Item (56), under "OTHER PUBLICATIONS", in Column 2, Line 69, delete "Effects"" and insert -- Effects," --, therefor.

CERTIFICATE OF CORRECTION (continued)
U.S. Pat. No. 8,373,153 B2

Title Page 2, in Item (56), under "OTHER PUBLICATIONS", in Column 2, Line 71, delete "al" and insert -- al., --, therefor.

Title Page 2, in Item (56), under "OTHER PUBLICATIONS", in Column 2, Line 72, delete "transistor"" and insert -- transistor," --, therefor.

Title Page 3, in Item (56), under "OTHER PUBLICATIONS", in Column 1, Line 1, delete "al" and insert -- al., --, therefor.

Title Page 3, in Item (56), under "OTHER PUBLICATIONS", in Column 1, Line 2, delete "heterostructures"" and insert -- heterostructures," --, therefor.

Title Page 3, in Item (56), under "OTHER PUBLICATIONS", in Column 1, Line 4, delete "al" and insert -- al., --, therefor.

Title Page 3, in Item (56), under "OTHER PUBLICATIONS", in Column 1, Line 5, delete "well"" and insert -- well," --, therefor.

Title Page 3, in Item (56), under "OTHER PUBLICATIONS", in Column 1, Line 7, delete "Ahn "Time-convolutionless reduced-desnsity-operator" and insert -- Ahn, "Time-convolutionless reduced-density-operator --, therefor.

Title Page 3, in Item (56), under "OTHER PUBLICATIONS", in Column 1, Line 9, delete "semiconductors"" and insert -- semiconductors," --, therefor.

Title Page 3, in Item (56), under "OTHER PUBLICATIONS", in Column 1, Line 11, delete "Ahn "Time-convolutionless reduced-desnsity-operator" and insert -- Ahn, "Time-convolutionless reduced-density-operator --, therefor.

Title Page 3, in Item (56), under "OTHER PUBLICATIONS", in Column 1, Line 13, delete "semiconductor"" and insert -- semiconductor," --, therefor.

Title Page 3, in Item (56), under "OTHER PUBLICATIONS", in Column 1, Line 15, delete "al" and insert -- al., --, therefor.

Title Page 3, in Item (56), under "OTHER PUBLICATIONS", in Column 1, Lines 16-17, delete "semiconductors"" and insert -- semiconductors," --, therefor.

Title Page 3, in Item (56), under "OTHER PUBLICATIONS", in Column 1, Line 29, delete "al" and insert -- al., --, therefor.

Title Page 3, in Item (56), under "OTHER PUBLICATIONS", in Column 1, Lines 30-31, delete "diode" Appl. Phys. Lett. 91, 171103" and insert -- diode," Appl. Phys. Lett., 91, 171103, --, therefor.

CERTIFICATE OF CORRECTION (continued)
U.S. Pat. No. 8,373,153 B2

Title Page 3, in Item (56), under "OTHER PUBLICATIONS", in Column 1, Line 32, delete "al "Lateral Injection Lasers"" and insert -- al., "Lateral Injection Lasers," --, therefor.

Title Page 3, in Item (56), under "OTHER PUBLICATIONS", in Column 1, Lines 35-37, delete "R. Paschotta "Encyclopedia of Laser Physics and Technology, Volume 1", Wiley-VCH, 2008, ISBN 3527408282, 9783527408283 p. 595." and insert -- R. Paschotta, "Encyclopedia of Laser Physics and Technology, Volume 1", Wiley-VCH, 2008, ISBN 3527408282, 9783527408283, p. 595. --, therefor.

Title Page 3, in Item (56), under "OTHER PUBLICATIONS", in Column 1, Lines 38-40, delete "S. Bai, et al. "Determination of the electric field in 4H/3C/4H-SiC quantum wells due to spontaneous polarization in the 4H SiC matrix" Appl. Phys. Lett. 83,3171 (2003)." and insert -- S. Bai, et al., "Determination of the electric field in 4H/3C/4H-SiC quantum wells due to spontaneous polarization in the 4H SiC matrix," Appl. Phys. Lett., 83,3171, (2003). --, therefor.

Title Page 3, in Item (56), under "OTHER PUBLICATIONS", in Column 2, Lines 2-3, delete "Nanothecnology. TNT2004. Phantoms Foundations. Segovia (Spain)." and insert -- Nanotechnology, TNT2004, Phantoms Foundations, Segovia (Spain), --, therefor.

Title Page 3, in Item (56), under "OTHER PUBLICATIONS", in Column 2, Line 14, delete "111118 (2006), 3" and insert -- 111118, (2006), 3 --, therefor.

Title Page 3, in Item (56), under "OTHER PUBLICATIONS", in Column 2, Lines 19-20, delete "al, Exchange interaction and polariton effects in quantum-well excitons," and insert -- al., "Exchange interaction and polariton effects in quantum-well excitons," --, therefor.

Title Page 3, in Item (56), under "OTHER PUBLICATIONS", in Column 2, Lines 30-31, delete "Temperature dependence of exciton peak energies in Cui quantum dots, Solid State Communications," and insert -- "Temperature dependence of exciton peak energies in Cui quantum dots, Solid State Communications," --, therefor.

Title Page 3, in Item (56), under "OTHER PUBLICATIONS", in Column 2, Line 33, insert -- Goosen, K.W., "Excitonic electroabsorption in extremely shallow quantum wells," Appl. Phys. Lett., Vol. 57, Issue 27, pp. 2582-2584. --, therefor.

Title Page 3, in Item (56), under "OTHER PUBLICATIONS", in Column 2, Line 45, delete "ZnS/CdS/ZnS"" and insert -- ZnS/CdS/ZnS," --, therefor.

Title Page 3, in Item (56), under "OTHER PUBLICATIONS", in Column 2, Line 59, delete "al," and insert -- al., --, therefor.

Title Page 3, in Item (56), under "OTHER PUBLICATIONS", in Column 2, Line 67, delete "Vaccum," and insert -- Vacuum, --, therefor.

CERTIFICATE OF CORRECTION (continued)
U.S. Pat. No. 8,373,153 B2

In the Specifications:

In Column 1, Line 7, delete "2009" and insert -- 2009, --, therefor.

In Column 3, Line 29, delete "eV" and insert -- eV. --, therefor.

In Column 6, Line 18, delete "bean" and insert -- beam --, therefor.

In Column 6, Line 49, delete "bean" and insert -- beam --, therefor.

In Column 9, Line 54, delete "eV" and insert -- eV, --, therefor.

In Column 10, Line 40, delete "bean" and insert -- beam --, therefor.

In the Claims:

In Column 12, Line 65, in Claim 4, delete "$Cd_xZn_{1-x},S$" and insert -- $Cd_xZn_{1-x}S$ --, therefor.